(12) United States Patent
Kim

(10) Patent No.: US 8,330,533 B2
(45) Date of Patent: Dec. 11, 2012

(54) SEMICONDUCTOR DEVICE AND OPERATING METHOD THEREOF

(75) Inventor: Chul Kim, Gyeonggi-do (KR)

(73) Assignee: Hynix Semiconductor Inc., Gyeonggi-do (KR)

(*) Notice: Subject to any disclaimer, the term of this patent is extended or adjusted under 35 U.S.C. 154(b) by 116 days.

(21) Appl. No.: 12/911,138

(22) Filed: Oct. 25, 2010

(65) Prior Publication Data

US 2012/0025900 A1    Feb. 2, 2012

(30) Foreign Application Priority Data

Jul. 30, 2010   (KR) .................. 10-2010-0073781

(51) Int. Cl.
*G05F 1/10* (2006.01)
(52) U.S. Cl. ....................................... 327/543
(58) Field of Classification Search .......... 327/534, 327/535, 538, 540, 541, 543
See application file for complete search history.

(56) References Cited

U.S. PATENT DOCUMENTS

| | | | | |
|---|---|---|---|---|
| 6,154,411 A * | 11/2000 | Morishita | ...................... | 365/226 |
| 6,828,848 B2 * | 12/2004 | Lee | ............................... | 327/534 |
| 6,943,613 B2 * | 9/2005 | Miyazaki et al. | ............. | 327/534 |
| 7,839,205 B2 * | 11/2010 | Hirobe | .......................... | 327/540 |
| 8,120,410 B2 * | 2/2012 | Meijer et al. | ................... | 327/534 |

FOREIGN PATENT DOCUMENTS

JP    2000-173266    6/2000

OTHER PUBLICATIONS

Notice of Allowance issued by the Korean Intellectual Property Office on May 21, 2012.

* cited by examiner

*Primary Examiner* — Jeffrey Zweizig
(74) *Attorney, Agent, or Firm* — IP & T Group LLP

(57) ABSTRACT

A semiconductor device includes a first internal voltage driving unit configured to drive an internal voltage, a second internal voltage driving unit configured to drive the internal voltage in an operation period corresponding to an enable signal, a current amount detection unit configured to detect amount of current supplied by the first internal voltage driving unit, and a current amount comparison unit configured to compare the amount of detected current by the current amount detection unit with amount of a reference current, and determine whether or not to activate the enable signal in response to a comparison result.

33 Claims, 7 Drawing Sheets

SEMICONDUCTOR DEVICE AND OPERATING METHOD THEREOF

CROSS-REFERENCE TO RELATED APPLICATIONS

The present application claims priority of Korean Patent Application No. 10-2010-0073781, filed on Jul. 30, 2010, which is incorporated herein by reference in its entirety.

BACKGROUND OF THE INVENTION

Exemplary embodiments of the present invention relate to a semiconductor design technology, and more particularly, to an internal voltage generation circuit of a semiconductor device.

In semiconductor devices including a DRAM, internal voltage generators are provided inside a chip to generate a plurality of internal voltages with various voltage levels by using a power supply voltage (VDD) and a ground voltage (VSS) supplied from an outside. The plurality of internal voltages are used for operations of internal circuits of the chip.

In general, processes for generating the plurality of internal voltages include a process for generating a reference voltage with a reference voltage level, and a process for generating the internal voltages through charge pumping or down converting (VDC: voltage down converting or LDO: low drop out) by using the generated reference voltage.

Among the internal voltages of the semiconductor device, a boosting voltage (VPP) and a back bias voltage (VBB) are typically generated through the charge pumping and a core voltage (VCORE) are typically generated through the down converting.

The boosting voltage (VPP) is a voltage which has a voltage level higher than the external power supply voltage (VDD). The boosting voltage (VPP) is supplied to a word line coupled to the gate of a cell transistor when a cell is accessed so as to prevent loss of cell data due to the threshold voltage (Vth) of the cell transistor.

The back bias voltage (VBB) is a voltage which has a voltage level lower than the external ground voltage (VSS). The back bias voltage (VBB) is generated to suppress the change of the threshold voltage (Vth) of the cell transistor due to a body effect on the cell transistor, thereby improving operational stability of the cell transistor and reducing channel leakage current induced in the cell transistor.

The core voltage (VCORE) is a voltage which has a voltage level lower than the external power supply voltage (VDD) and higher than the external ground voltage (VSS). The core voltage (VCORE) is generated to decrease the magnitude of power for maintaining the voltage level of the data stored in a cell and ensure stable operation of the cell transistor.

Internal voltage generators for generating the internal voltages (VPP, VBB and VCORE) are designed to operate with predetermined deviation values within operation voltage and temperature ranges of the semiconductor device.

FIG. 1 is a block diagram illustrating a conventional circuit for generating an internal voltage in a voltage down converting type in a semiconductor device.

Referring to FIG. 1, a conventional circuit for generating an internal voltage in a voltage down converting type in a semiconductor device includes an enable signal generation unit 100, a reference voltage generation unit 140 and a plurality of internal voltage generation units 120A, 120B, 120C, 121A and 121B. The enable signal generation unit 100 is configured to generate a plurality of enable signals ENABLE1 and ENABLE2 corresponding to operations of a semiconductor device based on a command COMMAND applied from an outside. The reference voltage generation unit 140 is configured to generate a reference voltage REF which maintains a constant level regardless of variations in PVT (process, voltage and temperature) of the semiconductor device. The plurality of internal voltage generation units 120A, 120B, 120C, 121A and 121B are configured to generate internal voltages VINT through down converting based on a predetermined target level corresponding to the reference voltage REF and be controlled in its on/off operation in response to the plurality of enable signals ENABLE1 and ENABLE2.

In detail, the plurality of internal voltage generation units 120A, 120B, 120C, 121A and 121B include first internal voltage detection sections 122A, 122B and 122C, second internal voltage detection sections 123A and 123B, first voltage driving sections 124A, 124B and 124C, and second voltage driving sections 125A and 125B. The first internal voltage detection sections 122A, 122B and 122C are configured to be controlled in their on/off operations in response to a first enable signal ENABLE1 among the plurality of enable signals ENABLE1 and ENABLE2. The second internal voltage detection sections 123A and 123B are configured to be controlled in their on/off operations in response to a second enable signal ENABLE2 among the plurality of enable signals ENABLE1 and ENABLE2. The first voltage driving sections 124A, 124B and 124C are configured to drive the terminals of the internal voltages VINT to a voltage level corresponding to the predetermined target level based on the reference voltage REF in response to output signals VINT_DET0, VINT_DET1 and VINT_DET2 of the first internal voltage detection sections 122A, 122B and 122C. The second voltage driving sections 125A and 125B are configured to drive the terminals of the internal voltages VINT to a voltage level corresponding to the predetermined target level based on the reference voltage REF in response to output signals VINT_DET3 and VINT_DET4 of the second internal voltage detection sections 123A and 123B.

The internal voltages VINT generated through the processes described above are inputted to an internal circuit 160 of the semiconductor device and are used to perform predetermined internal operations.

In the conventional circuit for generating an internal voltage in a voltage down converting type in a semiconductor device, the on/off operations of the plurality of internal voltage generation sections 120A, 120B, 120C, 121A and 121B are controlled by the plurality of enable signals ENABLE1 and ENABLE2 of which activation or deactivation is determined in response to the command COMMAND applied from the outside.

Accordingly, in the conventional semiconductor device, the number of internal voltage generation units 120A, 120B and 120C, 121A and 121C which are to be provided to generate the internal voltages through down converting may be determined based on design needs. Thus, a conventional method for generating internal voltages raises the following concerns.

First, since the number of internal voltage generation units 120A, 120B and 120C, 121A and 121C for the stable internal voltage may not be accurately predicted while a semiconductor device is designed, an increased number of internal voltage generation units 120A, 120B and 120C, 121A and 121C may be disposed in the semiconductor device in preparation for a worst case. As a consequence, the entire area of the semiconductor device may increase.

Second, in designing the semiconductor device, the number of internal voltage generation units 120A, 120B and 120C, 121A and 121C controlled by one enable signal ENABLE1 or ENABLE2 among the plurality of enable signals ENABLE1 and ENABLE2 is to be determined. At this time, because there is no common standard that the number of internal voltage generation units 120A, 120B and 120C, 121A and 121C should be determined based on, the number of internal voltage generation units 120A, 120B and 120C, 121A and 121C may be determined based on the prediction a forecast made in view of such a simulation result, which may not be accurate. Due to this fact, as an increased number of internal voltage generation units 120A, 120B and 120C, 121A and 121C, which is greater than the number of internal voltage generation units for the actual operation, are controlled by one of the plurality of enable signals ENABLE1 and ENABLE2, power consumption of the semiconductor device may increase.

Also, when determining in advance the number of internal voltage generation units 120A, 120B and 120C, 121A and 121C, since amount of current which increases due to variations in PVT (process, voltage and temperature) can be additionally considered (as a preparation for a worst case), an increased number of internal voltage generation units 120A, 120B and 120C, 121A and 121C, which is greater than the number of the internal voltage generation units for the actual operation, are to be designed to be turned on at a time. Hence, even if the number of internal voltage generation units 120A, 120B and 120C, 121A and 121C for the actual operation are disposed in the semiconductor device based on the relatively accurate simulation result, an increased amount of current which is greater by several mA to several ten mA than the amount of current to be consumed for the actual operation may be consumed, which raises a concern.

In the above-mentioned example, three internal voltage generation units 120A, 120B and 120C are on/off-controlled in response to the first enable signal ENABLE1, and two internal voltage generation units 121A and 121B are on/off-controlled in response to the second enable signal ENABLE2. A determination is made as to how to match the plurality of enable signals ENABLE1 and ENABLE2 with the plurality of internal voltage generation units 120A, 120B and 120C, 121A and 121C based on a simulation result which may not be accurate and a forecast made based on a worst case scenario. Therefore, actually, the semiconductor device may operate stably even when, for example, two internal voltage generation units 120A and 120B are on/off-controlled in response to the first enable signal ENABLE1 and one internal voltage generation unit 121A is on/off-controlled in response to the second enable signal ENABLE2. At this time, an increased number of internal voltage generation units 120A, 120E and 120C, 121A and 121C may cause a defect in the semiconductor device.

Since it is difficult to detect the occurrence of such a defect after the semiconductor device is mounted and used, it is also difficult to prevent the occurrence of the defects.

SUMMARY OF THE INVENTION

An embodiment of the present invention is directed to a semiconductor device which has an internal voltage generation circuit configured to detect an amount of current consumed due to use of internal voltages in real time and use an optimized amount of current.

In accordance with an exemplary embodiment of the present invention, a semiconductor device includes a first internal voltage driving unit configured to drive an internal voltage, a second internal voltage driving unit configured to drive the internal voltage in an operation period corresponding to an enable signal, a current amount detection unit configured to detect amount of current supplied by the first internal voltage driving unit, and a current amount comparison unit configured to compare the amount of detected current by the current amount detection unit with amount of a reference current, and determine whether or not to activate the enable signal in response to a comparison result.

In accordance with another exemplary embodiment of the present invention, a semiconductor device includes a first internal voltage driving unit configured to drive an internal voltage, a plurality of second internal voltage driving units configured to respectively drive the internal voltage in response to a plurality of enable signals, a current amount detection unit configured to detect amount of current supplied by the first internal voltage driving unit, and a current amount comparison unit configured to compare the amount of detected current by the current amount detection unit with amount of a reference current which changes depending upon the number of enable signals activated among the plurality of enable signals, and control the number of enable signals to be activated in response to a comparison result.

In accordance with further exemplary embodiment of the present invention, a method for operating a semiconductor device includes detecting amount of current, supplied from a terminal of a power supply voltage to an output terminal of an internal voltage, based on a first reference current amount when the output terminal of the internal voltage is driven by using a first driving force, and determining whether or not to activate a first enable signal, driving the output terminal of the internal voltage using a first summed driving force obtained by summing the first driving force and a second driving force in response to the first enable signal, detecting amount of current, supplied from the terminal of the power supply voltage to the output terminal of the internal voltage, based on a second reference current amount when the output terminal of the internal voltage is driven by using the first summed driving force, and determining whether or not to activate a second enable signal, and driving the output terminal of the internal voltage using a second summed driving force obtained by summing the first and second driving forces and a third driving force, in response to the second enable signal.

In accordance with still further exemplary embodiment of the present invention, a semiconductor device includes a comparison sourcing current amount control section configured to control a reference current which of level varies in response to a plurality of enable signals to flow from a terminal of a power supply voltage to a current amount comparison node in response to a current amount reference voltage, a comparison sinking current amount control section configured to control a detected current to flow from the current amount comparison node to a terminal of a ground voltage, and an enable signal generation section configured to generate the plurality of enable signal by comparing a voltage level of the current amount comparison node with an enable reference voltage.

DESCRIPTION OF SPECIFIC EMBODIMENTS

Figure 1:
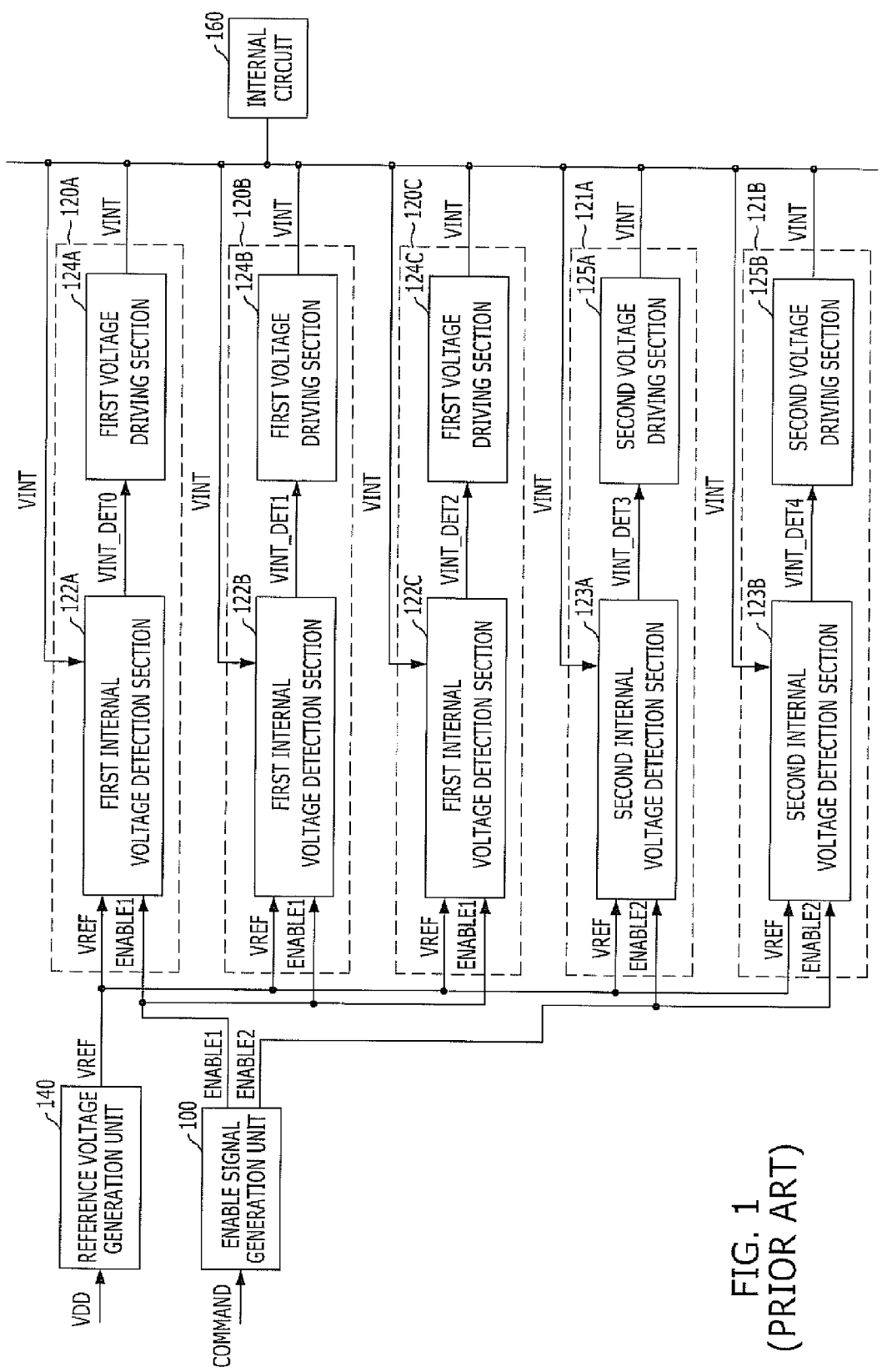
FIG. 1 is a block diagram illustrating a conventional circuit for generating an internal voltage in a voltage down converting type in a semiconductor device.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

First Embodiment

Figure 2:
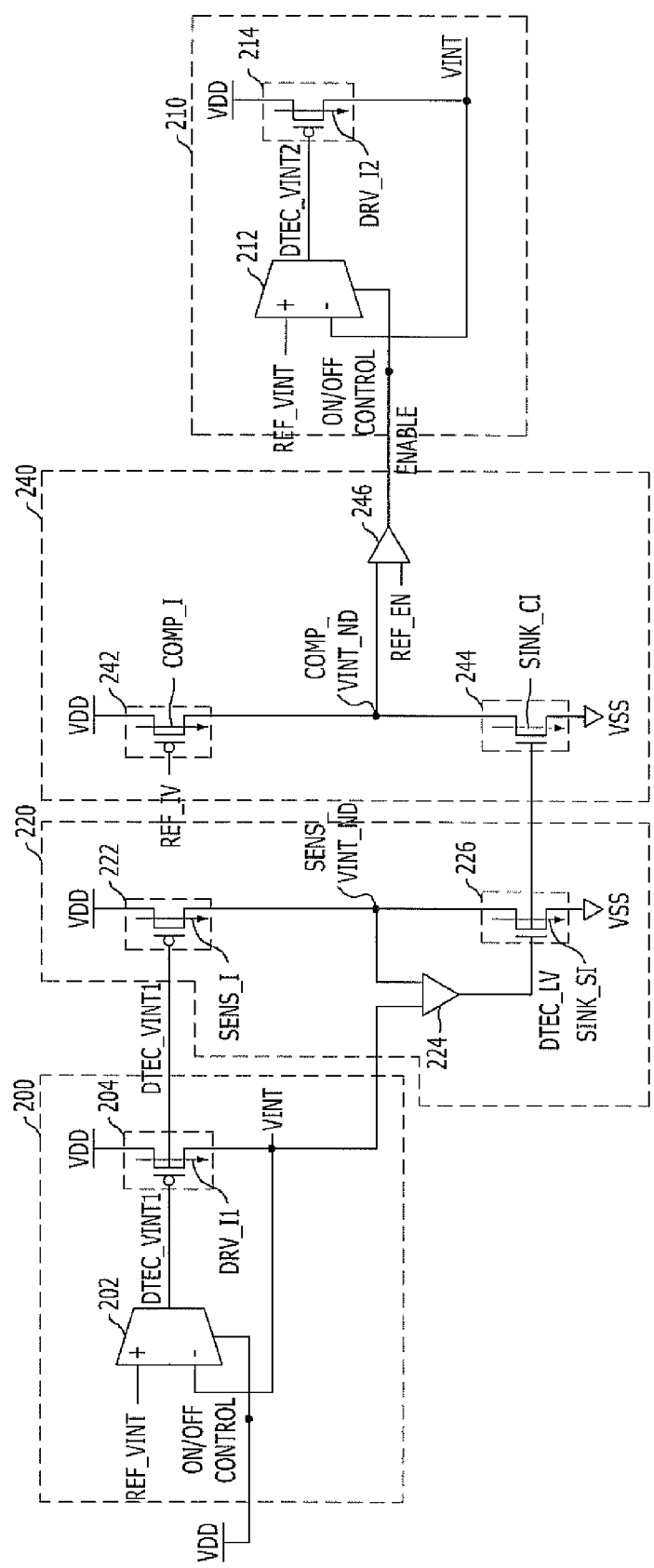
FIG. 2 is a block diagram illustrating a circuit for generating an internal voltage in a voltage down converting type in a semiconductor device in accordance with a first embodiment of the present invention.

FIG. 2 is a block diagram illustrating a circuit for generating an internal voltage in a voltage down converting type in a semiconductor device in accordance with a first embodiment of the present invention.

Referring to FIG. 2, the circuit for generating the internal voltage in the voltage down converting type in the semiconductor device in accordance with the first embodiment of the present invention includes a first internal voltage driving unit 200, a second internal voltage driving unit 210, a current amount detection unit 220, and a current amount comparison unit 240. The first internal voltage driving unit 200 is configured to drive an internal voltage (VINT) output terminal. The second internal voltage driving unit 210 is configured to drive the internal voltage (VINT) output terminal in an operation period corresponding to an enable signal ENABLE. The current amount detection unit 220 is configured to detect the amount of first driving current DRV_I1 supplied to the internal voltage (VINT) output terminal, and output a sense sourcing current SENS_I. The current amount comparison unit 240 is configured to compare amount of the sense sourcing current SENS_I with amount of reference current COMP_I and determine whether or not to activate the enable signal ENABLE in correspondence to a comparison result.

The first internal voltage driving unit 200 includes a first level comparison section 202 and a first drive current amount control section 204. The first level comparison section 202 is configured to compare a voltage level of the internal voltage (VINT) output terminal with a level reference voltage REF_VINT to output a first detection signal DTEC_VINT1. The first drive current amount control section 204 is configured to control the amount of the first driving current DRV_I1 which flows from a power supply voltage (VDD) terminal to the internal voltage (VINT) output terminal, in response to the first detection signal DTEC_VINT1.

The second internal voltage driving unit 210 includes a second level comparison section 212, and a second drive current amount control section 214. The second level comparison section 212 is configured to be controlled in the on/off operation thereof in response to the enable signal ENABLE and compare the voltage level of the internal voltage (VINT) output terminal with the level reference voltage REF_VINT to output a second detection signal DTEC_VINT2. The second drive current amount control section 214 is configured to control amount of a second driving current DRV_I2 which flows from the power supply voltage (VDD) terminal to the internal voltage (VINT) output terminal, in response to the second detection signal DTEC_VINT2.

The current amount detection unit 220 includes a sense sourcing current amount control section 222, a level detection section 224, and a sense sinking current amount control section 226. The sense sourcing current amount control section 222 is configured to control the amount of the sense sourcing current SENS_I which flows from the power supply voltage (VDD) terminal to a current amount sensing node SENS_VINT_ND, in response to the first detection signal DTEC_VINT1. The level detection section 224 is configured to detect a difference in voltage level between the internal voltage (VINT) output terminal and the current amount sensing node SENS_VINT_ND to output a level detection signal DTEC_LV. The sense sinking current amount control section 226 is configured to control the amount of sense sinking current SINK_SI which flows from the current amount sensing node SENS_VINT_ND to a ground voltage (VSS) terminal, in response to the level detection signal DTEC_LV.

The current amount comparison unit 240 includes a comparison sourcing current amount control section 242, comparison sinking current amount control section 244, and an enable signal generation section 246. The comparison sourcing current amount control section 242 is configured to control current with the amount of the reference current COMP_I to flow between the power supply voltage (VDD) terminal and a current amount comparison node COMP_VINT_ND, in response to a current amount reference voltage REF_IV. The comparison sinking current amount control section 244 is configured to control the amount of compare sinking current SINK_CI which flows from the current amount comparison node COMP_VINT_ND to the ground voltage (VSS) terminal, in response to the level detection signal DTEC_LV. The enable signal generation section 246 is configured to generate the enable signal ENABLE of which activation or deactivation is determined in response to the voltage level of the current amount comparison node COMP_VINT_ND.

Hereinafter, operations of the circuit for generating the internal voltage in the voltage down converting type in the semiconductor device in accordance with the first embodiment of the present invention, configured as mentioned above, is described.

First, the first internal voltage driving unit 200 may always operate as long as the power supply voltage VDD is supplied to the semiconductor device. Meanwhile, the second internal voltage driving unit 210 may operate when the enable signal ENABLE is activated in a state in which the power supply voltage VDD is supplied to the semiconductor device, and may not operate when the enable signal ENABLE is deactivated.

Accordingly, in a state right after the semiconductor device is initialized, only the first internal voltage driving unit 200 may operate, and the second internal voltage driving unit 210 may not operate.

Describing the operation of the first internal voltage driving unit 200 in detail, among the component elements of the first internal voltage driving unit 200, the first level comparison section 202 outputs the first detection signal DTEC_VINT1 which is deactivated to a logic high level when the voltage level of the internal voltage (VINT) output terminal is higher than the level reference voltage REF_VINT, and outputs the first detection signal DTEC_VINT1 which is activated to a logic low level when the voltage level of the internal voltage (VINT) output terminal is lower than the level reference voltage REF_VINT.

In the first drive current amount control section 204 among the component elements of the first internal voltage driving unit 200, when the first detection signal DTEC_VINT1 is deactivated to the logic high level, the amount of the first driving current DRV_I1, which flows from the power supply voltage (VDD) terminal to the internal voltage (VINT) output terminal, becomes '0'. Conversely, when the first detection signal DTEC_VINT1 is activated to the logic low level, the amount of the first driving current DRV_I1 is determined in correspondence to the driving force of the first drive current amount control section 204.

For example, if the driving force of the first drive current amount control section 204 corresponds to such an extent that can permit flow of current of approximately maximum '100 mA' from the power supply voltage (VDD) terminal to the internal voltage (VINT) output terminal, the first drive current amount control section 204 may control the first driving current DRV_I1 with any one magnitude less than approximately '100 mA' to flow between the power supply voltage (VDD) terminal and the internal voltage (VINT) output terminal, in correspondence to the activation of the first detection signal DTEC_VINT1 to the logic low level.

The amount of the current, which flows from the first drive current amount control section 204 to the internal voltage (VINT) output terminal, is used to keep the voltage level of the internal voltage (VINT) output terminal at a predetermined voltage level. Therefore, even though the amount of the current, which flows from the first drive current amount control section 204 to the internal voltage (VINT) output terminal, changes drastically, the voltage level of the internal voltage (VINT) output terminal may not vary substantially.

Meanwhile, in a semiconductor device, the voltage level of the internal voltage (VINT) output terminal may be continuously lower than a target voltage level corresponding to the voltage level of the level reference voltage REF_VINT due to the increasing use of the internal voltage VINT, even though a maximum amount of current capable of being supplied by the first drive current amount control section 204 is supplied to the internal voltage (VINT) output terminal. The circuit for generating an internal voltage in a voltage down converting type in a semiconductor device in accordance with the first embodiment of the present invention senses such a phenomenon and controls the second internal voltage driving unit 210 to operate depending upon a sensing result, so that the voltage level of the internal voltage (VINT) output terminal is maintained close to the target voltage level.

In detail, the sense sourcing current amount control section 222 among the component elements of the current amount detection unit 220 is controlled in its operation in response to the first detection signal DTEC_VINT1 outputted from the first level comparison section 202 among the component elements of the first internal voltage driving unit 200. That is to say, the sense sourcing current amount control section 222 performs the same operation as the first drive current amount control section 204 among the component elements of the first internal voltage driving unit 200.

Accordingly, the sense sourcing current amount control section 222 controls a specified amount of current to flow from the power supply voltage (VDD) terminal to the current amount sensing node SENS_VINT_ND in response to the activation of the first detection signal DTEC_VINT1 outputted from the first level comparison section 202 to the logic low level. The amount of current which flows between the power supply voltage (VDD) terminal and the current amount sensing node SENS_VINT_ND is determined depending upon the driving force of the sense sourcing current amount control section 222.

For example, if the driving force of the sense sourcing current amount control section 222 corresponds to such an extent that can permit flow of current of approximately maximum '1000 µA' from the power supply voltage (VDD) terminal to the current amount sensing node SENS_VINT_ND, the sense sourcing current amount control section 222 may control the sense sourcing current SENS_I with any one magnitude less than approximately '1000 µA' to flow between the power supply voltage (VDD) terminal and the current amount sensing node SENS_VINT_ND, in correspondence to the activation of the first detection signal DTEC_VINT1 to the logic low level.

For reference, because an operation purpose of the sense sourcing current amount control section 222 is all the way to detect the amount of current supplied to the internal voltage (VINT) output terminal according to the operation of the first internal voltage driving unit 200, it is not necessary for the sense sourcing current amount control section 222 to have a large driving force like that of the first drive current amount control section 204 disposed in the first internal voltage driving unit 200. In general, as exemplified above, the driving force of the sense sourcing current amount control section 222 may be set to correspond to $\frac{1}{100}$ of the driving force of the first drive current amount control section 204.

In this way, in the present embodiment, in a state in which the sense sourcing current amount control section 222 has a driving force smaller, by a specified number of times generally set to $\frac{1}{100}$, than the driving force of the first drive current amount control section 204, the sense sourcing current amount control section 222 operates in correspondence to the first detection signal DTEC_VINT1 in a manner similar to the first drive current amount control section 204. Due to this fact, the sense sourcing current SENS_I, with a magnitude that is obtained by decreasing the amount of the first driving current DRV_I1 supplied from the power supply voltage (VDD) terminal to the internal voltage (VINT) output terminal through the first drive current amount control section 204, can be supplied from the power supply voltage (VDD) terminal to the current amount sensing node SENS_VINT_ND.

Among the component elements of the current amount comparison unit 240, the comparison sourcing current amount control section 242 controls the reference current COMP_I with a magnitude determined in advance to flow between the power supply voltage (VDD) terminal and the current amount comparison node COMP_VINT_ND, in response to the current amount reference voltage REF_IV.

In other words, since the current amount reference voltage REF_IV is a signal which has a constant voltage level, the reference current COMP_I, which flows between the power supply voltage (VDD) terminal and the current amount comparison node COMP_VINT_ND, is in a state in which its magnitude is fixed.

For example, the reference current COMP_I with a magnitude of approximately '900 µA' may flow between the power supply voltage (VDD) terminal and the current amount comparison node COMP_VINT_ND by the comparison sourcing current amount control section 242.

Among the component elements of the current amount detection unit 220, the level detection section 224 controls the voltage level of the level detection signal DTEC_LV in a manner such that the internal voltage (VINT) output terminal and the current amount sensing node SENS_VINT_ND can have the same voltage level, and thereby, controls the operation of the sense sinking current amount control section 226 among the component elements of the current amount detection unit 220.

For example, in the case where the voltage level of the current amount sensing node SENS_VINT_ND is higher than that of the internal voltage (VINT) output terminal, the voltage level of the level detection signal DTEC_LV which is outputted from the level detection section 224 is raised such that the amount of the sense sinking current SINK_SI which flows from the current amount sensing node SENS_VINT_ND to the ground voltage (VSS) terminal increases. Due to this fact, the voltage level of the current amount sensing node SENS_VINT_ND decreases, as a result of which the voltage levels of the internal voltage (VINT) output terminal and the current amount sensing node SENS_VINT_ND become the same with each other.

Similarly, in the case where the voltage level of the current amount sensing node SENS_VINT_ND is lower than that of the internal voltage (VINT) output terminal, the voltage level of the level detection signal DTEC_LV which is outputted from the level detection section 224 is lowered such that the amount of the sense sinking current SINK_SI which flows from the current amount sensing node SENS_VINT_ND to the ground voltage (VSS) terminal decreases. Due to this fact, the voltage level of the current amount sensing node SENS_VINT_ND increases, as a result of which the voltage levels of the internal voltage (VINT) output terminal and the current amount sensing node SENS_VINT_ND become the same with each other.

The level detection section 224 among the component elements of the current amount detection unit 220 controls the operation of the sense sinking current amount control section 226 in the way as described above, and at the same time controls the operation of the comparison sinking current amount control section 244 among the component elements of the current amount comparison unit 240.

Namely, in a situation where the operation of the sense sinking current amount control section 226 is controlled in such a manner that the amount of the sense sinking current SINK_SI flowing from the current amount sensing node SENS_VINT_ND to the ground voltage (VSS) terminal increases, the operation of the comparison sinking current amount control section 244 is controlled in such a manner that the amount of the compare sinking current SINK_CI flowing from the current amount comparison node COMP_VINT_ND to the ground voltage (VSS) terminal also increases.

As the level detection section 224 simultaneously controls the operations of the sense sinking current amount control section 226 and the comparison sinking current amount control section 244 in this way, the amounts of current which is sunk in the current amount sensing node SENS_VINT_ND and the current amount comparison node COMP_VINT_ND are always the same with each other. Conversely, due to the fact that the amount of the sense sourcing current SENS_I supplied to the current amount sensing node SENS_VINT_ND by the first detection signal DTEC_VINT1 changes and the amount of the reference current COMP_I supplied to the current amount comparison node COMP_VINT_ND by the comparison sourcing current amount control section 242 is constant, the voltage level of the current amount comparison node COMP_VINT_ND changes depending upon the relationship between the amount of the sense sourcing current SENS_I supplied to the current amount sensing node SENS_VINT_ND and the amount of the reference current COMP_I supplied to the current amount comparison node COMP_VINT_ND.

For example, in the case where the amount of the sense sourcing current SENS_I supplied to the current amount sensing node SENS_VINT_ND is less than the amount of the reference current COMP_I supplied to the current amount comparison node COMP_VINT_ND, the amount of current sunk from the current amount comparison node COMP_VINT_ND to the ground voltage (VSS) terminal is smaller than the amount of current supplied from the power supply voltage (VDD) terminal to the current amount comparison node COMP_VINT_ND. The voltage level of the current amount comparison node COMP_VINT_ND increases.

Conversely, in the case where the amount of the sense sourcing current SENS_I supplied to the current amount sensing node SENS_VINT_ND is greater than the amount of the reference current COMP_I supplied to the current amount comparison node COMP_VINT_ND, the amount of current sunk from the current amount comparison node COMP_VINT_ND to the ground voltage (VSS) terminal is larger than the amount of current supplied from the power supply voltage (VDD) terminal to the current amount comparison node COMP_VINT_ND. The voltage level of the current amount comparison node COMP_VINT_ND decreases.

As described above, the level detection section 224 among the component elements of the current amount detection unit 220 plays a very important role of keeping the amounts of current sunk in the current amount sensing node SENS_VINT_ND and the current amount comparison node COMP_VINT_ND the same with each other. Such a role may be replaced by the configuration of a current mirroring circuit shown in FIG. 6.

Figure 6:
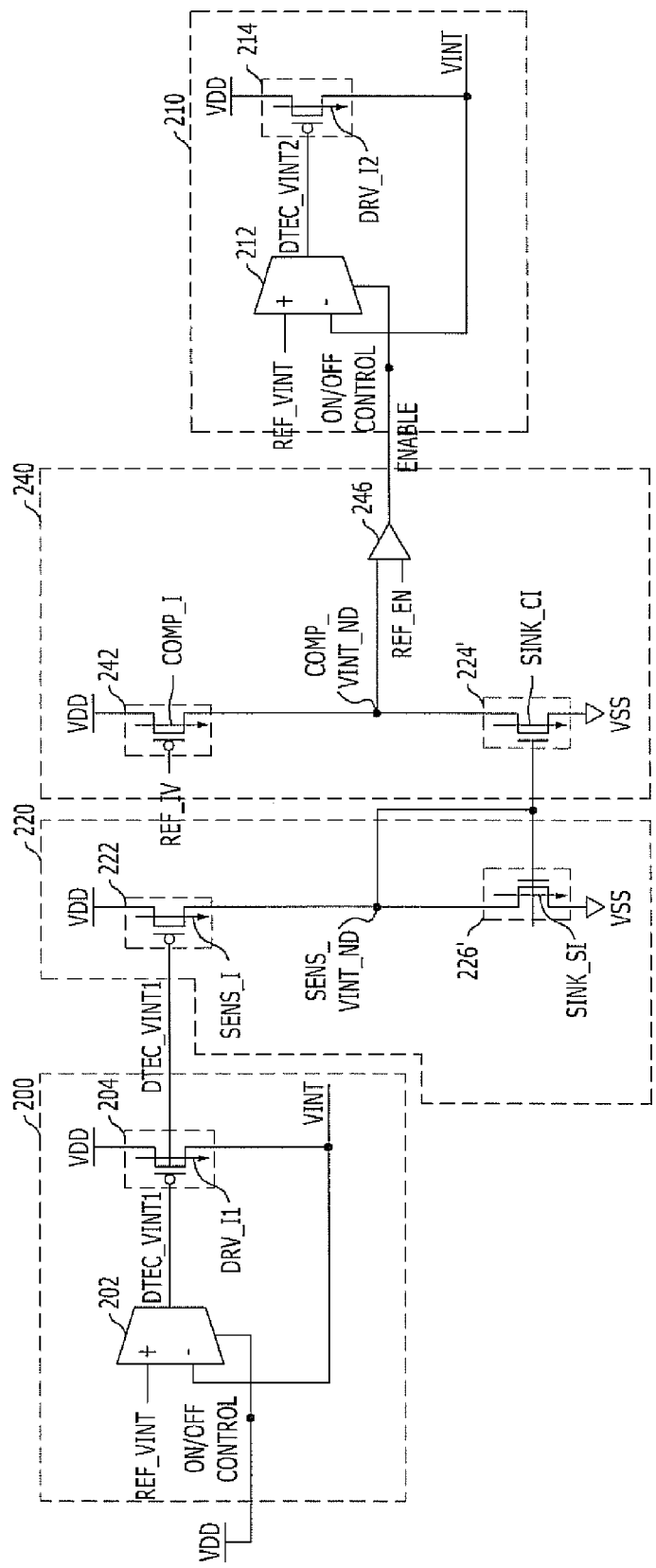
FIG. 6 is a block diagram for comparatively explaining the cases where a level detection section exists and does not exist in the circuit for generating the internal voltage in the voltage down converting type according to the first embodiment of the present invention shown in FIG. 2.

That is to say, referring to FIG. 6, the configuration of the current amount detection unit 220 can be modified to a type including a sense sourcing current amount control section 222 configured to control the amount of the sense sourcing current SENS_I which flows from the power supply voltage (VDD) terminal to the current amount sensing node SENS_VINT_ND, in response to the first detection signal DTEC_VINT1, and a sense sinking current amount control section 226' configured to control the amount of the sense sinking current SINK_SI which flows from the current amount sensing node SENS_VINT_ND to the ground voltage (VSS) terminal, depending upon the voltage level of the current amount sensing node SENS_VINT_ND.

Similarly, the configuration of the current amount comparison unit 240 can be modified to a type including a comparison sourcing current amount control section 242 configured to control current with the amount of the reference current COMP_I to flow between the power supply voltage (VDD) terminal and the current amount comparison node COMP_VINT_ND, in response to the current amount reference voltage REF_IV, a comparison sinking current amount control section 244' configured to control the amount of compare sinking current SINK_CI which flows from the current amount comparison node COMP_VINT_ND to the ground voltage (VSS) terminal, depending upon the voltage level of the current amount sensing node SENS_VINT_ND, and an enable signal generation section 246 configured to generate the enable signal ENABLE of which activation or deactivation is determined in response to the voltage level of the current amount comparison node COMP_VINT_ND.

Since the circuit for generating an internal voltage in a voltage down converting type in a semiconductor device in accordance with the first embodiment of the present invention is configured as shown in FIG. 6, the configuration may be simplified and the area occupied by the circuit may decrease, thereby reducing current consumption.

On the other hand, the voltage level of the internal voltage (VINT) output terminal and the voltage level of the current amount sensing node SENS_VINT_ND may deviate from each other as the operation of the semiconductor device continues, and owing to this fact, the amount of the current detected by the current amount detection unit 220 may not properly reflect the amount of the first driving current DRV_I1 supplied from the power supply voltage (VDD) terminal to the internal voltage (VINT) output terminal according to the operation of the first internal voltage driving unit 200.

Nevertheless, since all the characterizing features of the prevent invention can be realized not only by the internal voltage generation circuit of the type shown in FIG. 2 but also by the internal voltage generation circuit of the type shown in FIG. 6, the internal voltage generation circuit of the type shown in FIG. 6 of course falls under the scope of the present invention.

The enable signal generation section 246 among the component elements of the current amount comparison unit 240 activates and outputs the enable signal ENABLE when the voltage level of the current amount comparison node COMP_VINT_ND is lower than a voltage level of an enable reference voltage REF_EN with a preselected voltage level. Conversely, the enable signal generation section 246 deactivates and outputs the enable signal ENABLE when the voltage level of the current amount comparison node COMP_VINT_ND is higher than the voltage level of the enable reference voltage REF_EN with the preselected voltage level.

The operation of the enable signal generation section 246 configured as mentioned above is described below in the light of the operations of the current amount detection unit 220 and the current amount comparison unit 240. In the case where the amount of the sense sourcing current SENS_I detected by the current amount detection unit 220 as the amount of the current supplied from the power supply voltage (VDD) terminal to the current amount sensing node SENS_VINT_ND has a magnitude smaller than the amount of reference current COMP_I corresponding to the current amount comparison unit 240 as the amount of current supplied from the power supply voltage (VDD) terminal to the current amount comparison node COMP_VINT_ND, the enable signal ENABLE is outputted by being deactivated. Therefore, the second internal voltage driving unit 210 is in a state in which it performs no operation, and accordingly, only the first internal voltage driving unit 200 drives the internal voltage (VINT) output terminal such that the voltage level of the internal voltage (VINT) output terminal can maintain the target voltage level corresponding to the voltage level of the level reference voltage REF_VINT.

Conversely, in the case where the amount of the sense sourcing current SENS_I detected by the current amount detection unit 220 as the amount of current supplied from the power supply voltage (VDD) terminal to the current amount sensing node SENS_VINT_ND has a magnitude larger than the amount of reference current COMP_I corresponding to the current amount comparison unit 240 as the amount of current supplied from the power supply voltage (VDD) terminal to the current amount comparison node COMP_VINT_ND, the enable signal ENABLE is outputted by being activated. In other words, the second internal voltage driving unit 210 drives the internal voltage (VINT) output terminal in cooperation with the first internal voltage driving unit 200 such that the voltage level of the internal voltage (VINT) output terminal can maintain the target voltage level corresponding to the voltage level of the level reference voltage REF_VINT.

As apparent from the above description, in the circuit for generating an internal voltage in a voltage down converting type in a semiconductor device in accordance with the first embodiment of the present invention, the first internal voltage driving unit 200, which operates at the same time power is supplied to the semiconductor device, is provided, and the second internal voltage driving unit 210, which detects the amount of the current supplied from the power supply voltage (VDD) terminal to the internal voltage (VINT) output terminal and is controlled in its on/off operation in correspondence to a detection result, is additionally provided.

Through this, the second internal voltage driving unit 210 can operate when the internal voltage VINT is consumed to a level that exceeds the maximum amount of current capable of being supplied by the first internal voltage driving unit 200 in the semiconductor device. In other words, the amount of current consumed due to the use of the internal voltage VINT in the semiconductor device can be kept at an appropriate level.

Also, because a degree, to which the internal voltage VINT is consumed in the semiconductor device, can be measured more accurately in the present invention, measurement details can be taken into consideration when subsequently designing a semiconductor device, so that a semiconductor device with a reduced entire area of an internal voltage generation circuit can be realized.

Second Embodiment

Figure 3:
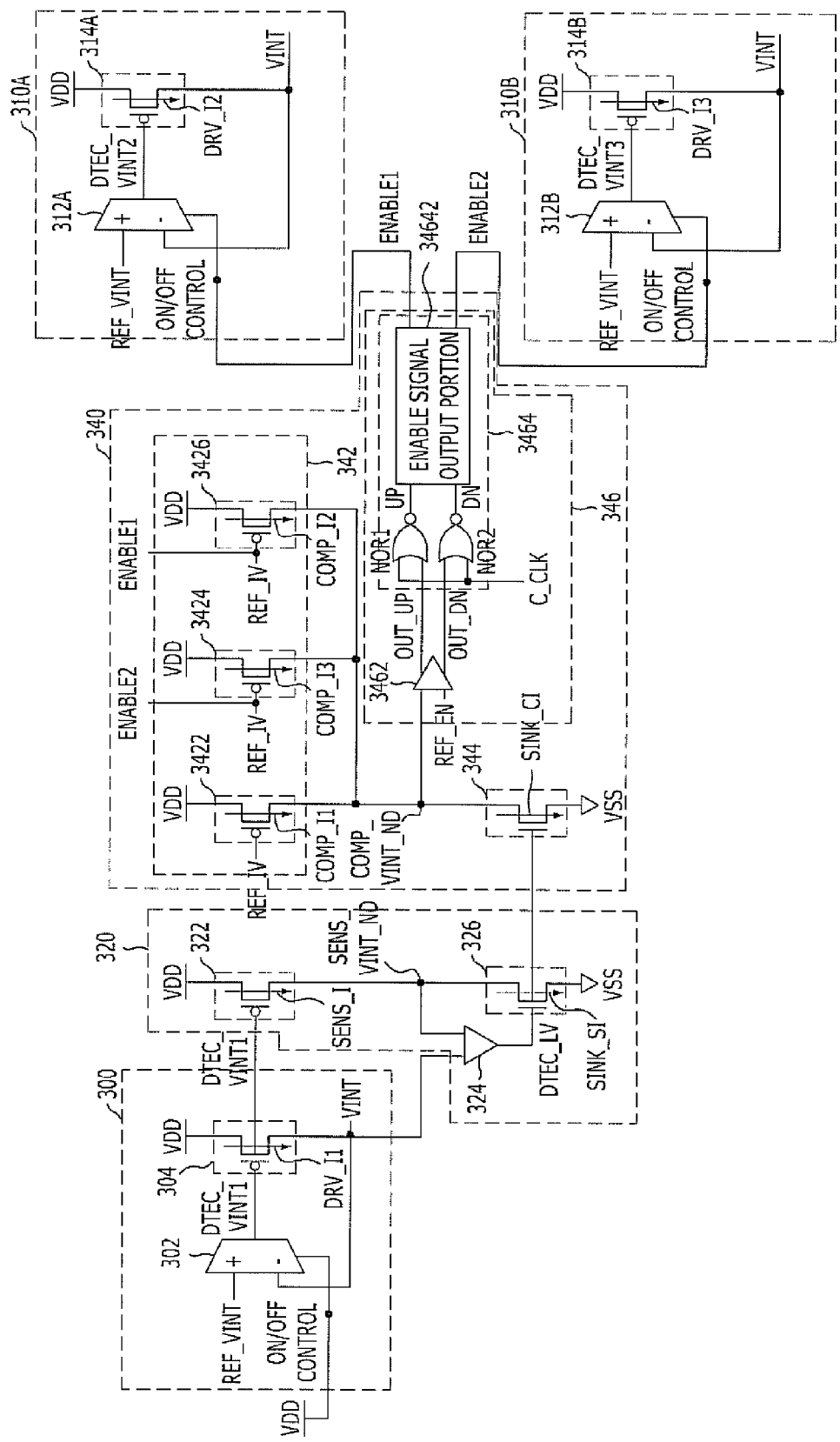
FIG. 3 is a block diagram illustrating a circuit for generating an internal voltage in a voltage down converting type in a semiconductor device in accordance with a second embodiment of the present invention.

FIG. 3 is a block diagram illustrating a circuit for generating an internal voltage in a voltage down converting type in a semiconductor device in accordance with a second embodiment of the present invention.

Referring to FIG. 3, the circuit for generating the internal voltage in the voltage down converting type in the semiconductor device in accordance with the second embodiment of the present invention includes a first internal voltage driving unit 300, a plurality of second internal voltage driving units 310A and 310B, a current amount detection unit 320, and a current amount comparison unit 340. The first internal voltage driving unit 300 is configured to drive an internal voltage (VINT) output terminal. The plurality of second internal voltage driving units 310A and 310B are configured to drive the internal voltage (VINT) output terminal in response to a plurality of enable signals ENABLE1 and ENABLE2, respectively. The current amount detection unit 320 is configured to detect amount of first driving current DRV_I1 supplied to the internal voltage (VINT) output terminal according to the operation of the first internal voltage driving unit 300, and output a sense sourcing current SENS_I. The current amount comparison unit 340 is configured to compare amount of the sense sourcing current SENS_I with amount of combination of reference currents, such as COMP_I1+COMP_I2+COMP_I3, COMP_I1+COMP_I3, or COMP_I1, which changes depending upon the number of enable signals activated among the plurality of enable signals ENABLE1 and ENABLE2, and control the number of enable signals to be activated among the plurality of enable signals ENABLE1 and ENABLE2 in correspondence to a comparison result.

The first internal voltage driving unit 300 includes a first level comparison section 302 and a first drive current amount control section 304. The first level comparison section 302 is configured to compare a voltage level of the internal voltage (VINT) output terminal with a level reference voltage REF_VINT to output a first detection signal DTEC_VINT1. The first drive current amount control section 304 is configured to control the amount of the first driving current DRV_I1 which flows from a power supply voltage (VDD) terminal to the internal voltage (VINT) output terminal, in response to the first detection signal DTEC_VINT1.

The plurality of second internal voltage driving units 310A and 310B include second level comparison sections 312A and 312B and second drive current amount control sections 314A and 314B. The second level comparison sections 312A and 312B are configured to be controlled in the on/off operation thereof in response to the enable signals ENABLE1 and ENABLE2 and compare the voltage level of the internal voltage (VINT) output terminal with the level reference voltage REF_VINT to output second detection signals DTEC_VINT2 and DTEC_VINT3, respectively. The second drive current amount control sections 314A and 314B are configured to control amount of second driving currents DRV_I2 and DRV_I3 which flow from the power supply voltage (VDD) terminal to the internal voltage (VINT) output terminal, in response to the second detection signals DTEC_VINT2 and DTEC_VINT3, respectively.

The current amount detection unit 320 includes a sense sourcing current amount control section 322, a level detection section 324, and a sense sinking current amount control section 326. The sense sourcing current amount control section 322 is configured to control the amount of the sense sourcing current SENS_I which flows from the power supply voltage (VDD) terminal to a current amount sensing node SENS_VINT_ND, in response to the first detection signal DTEC_VINT1. The level detection section 324 is configured to detect a difference in voltage level between the internal voltage (VINT) output terminal and the current amount sensing node SENS_VINT_ND to output a level detection signal DTEC_LV. The sense sinking current amount control section 326 is configured to control the amount of sense sinking current SINK_SI which flows from the current amount sensing node SENS_VINT_ND to a ground voltage (VSS) terminal, in response to the level detection signal DTEC_LV.

The current amount comparison unit 340 includes a comparison sourcing current amount control section 342, a comparison sinking current amount control section 344, and an enable signal generation section 346. The comparison sourcing current amount control section 342 is configured to control current with the amount of the combination of the reference currents such as COMP_I1+COMP_I2+COMP_I3, COMP_I1+COMP_I3, or COMP_I1 to flow between the power supply voltage (VDD) terminal and a current amount comparison node COMP_VINT_ND, in response to a current amount reference voltage REF_IV and the plurality of enable signals ENABLE1 and ENABLE2. The comparison sinking current amount control section 344 is configured to control the amount of compare sinking current SINK_CI which flows from the current amount comparison node COMP_VINT_ND to the ground voltage (VSS) terminal, in response to the level detection signal DTEC_LV. The enable signal generation section 346 is configured to generate the plurality of enable signals ENABLE1 and ENABLE2 of which activation or deactivation is determined in response to the voltage level of the current amount comparison node COMP_VINT_ND.

The comparison sourcing current amount control section 342 includes a basic comparison sourcing current amount control part 3422, and a plurality of additional comparison sourcing current amount control parts 3424 and 3426. The basic comparison sourcing current amount control part 3422 is configured to control the amount of reference current COMP_I1 which flows between the power supply voltage (VDD) terminal and the current amount comparison node COMP_VINT_ND, in response to the current amount reference voltage REF_IV. The plurality of additional comparison sourcing current amount control parts 3424 and 3426 are configured to be selectively controlled in on/off operations thereof in response to the plurality of enable signals ENABLE1 and ENABLE2 and control the amounts of reference currents COMP_I2 and COMP_I3 which flow between the power supply voltage (VDD) terminal and the current amount comparison node COMP_VINT_ND in response to the current amount reference voltage REF_IV.

The enable signal generation section 346 includes a level determination part 3462 and an activation control part 3464. The level determination part 3462 is configured to determine the voltage level of the current amount comparison node COMP_VINT_ND based on an enable reference voltage REF_EN to output a rising determination signal OUT_UP and a falling determination signal OUT_DN. The activation control part 3464 is configured to determine whether to activate or deactivate the plurality of enable signals ENABLE1 and ENABLE2 in response to the rising determination signal OUT_UP and the falling determination signal OUT_DN.

Among the component elements of the enable signal generation section 346, the activation control part 3464 includes first and second NOR gates NOR1 and NOR2 and an enable signal output portion 34642. The first and second NOR gates NOR1 and NOR2 are configured to generate a rising control signal UP and a falling control signal DN in response to the rising and falling determination signals OUT_UP and OUT_DN and a control clock C_CLK. The enable signal output portion 34642 is configured to output the plurality of enable signals ENABLE1 and ENABLE2 in response to the rising control signal UP and the falling control signal DN.

While the plurality of second internal voltage driving units 310A and 310B can be configured to drive the internal voltage (VINT) output terminal with respectively different driving forces, it is conceivable that the plurality of second internal voltage driving units 310A and 3108 can be configured to drive the internal voltage (VINT) output terminal with the same driving force. Therefore, it is to be noted that the magnitudes of the driving sizes respectively owned by the plurality of second internal voltage driving units 310A and 310B can be changed in a variety of ways according to design needs. It may be also applied when determining the size of the first internal voltage driving unit 310.

Figure 4A:
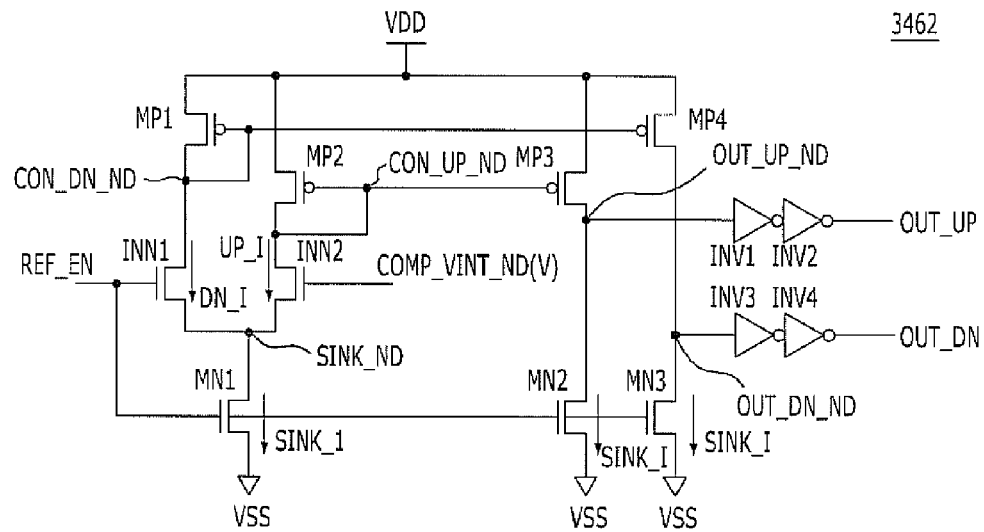
FIGS. 4A and 4B are circuit diagrams each illustrating in detail a level determination part among the component elements of the circuit for generating the internal voltage in the voltage down converting type according to the second embodiment of the present invention shown in FIG. 3.

FIG. 4A is a circuit diagram illustrating in detail an embodiment of the level determination part 3462 among the component elements of the circuit according to the second embodiment of the present invention shown in FIG. 3.

Referring to FIG. 4A, among the component elements of the circuit for generating the internal voltage in the voltage down converting type in the semiconductor device in accordance with the second embodiment of the present invention, the level determination part 3462 includes first and second input NMOS transistors INN1 and INN2, first to third current sinking NMOS transistors MN1 to MN3, first to fourth PMOS transistors MP1 to MP4, and first to fourth inverters INV1 to INV4.

The first input NMOS transistor INN1 is configured to have a drain-source path coupled between a falling determination control node CON_DN_ND and a current sinking node SINK_ND, and control amount of falling current DN_I in response to the enable reference voltage REF_EN applied to the gate thereof. The second input NMOS transistor INN2 is configured to have a drain-source path coupled between a rising determination control node CON_UP_ND and the current sinking node SINK_ND, and control amount of rising current UP_I in response to the voltage level of the current amount comparison node COMP_VINT_ND applied to the gate thereof.

The first current sinking NMOS transistor MN1 is configured to have a drain-source path coupled between the current sinking node SINK_ND and the ground voltage (VSS) terminal, and control amount of sinking current SINK_I in response to the enable reference voltage REF_EN applied to the gate thereof. The first and fourth PMOS transistors MP1 and MP4 are connected in a current mirror type between the falling determination control node CON_DN_ND and a falling determination output node OUT_DN_ND, and the second and third PMOS transistors MP2 and MP3 are connected in a current mirror type between the rising determination control node CON_UP_ND and a rising determination output node OUT_UP_ND. The second current sinking NMOS transistor MN2 is configured to have a drain-source path coupled between the rising determination output node OUT_UP_ND and the ground voltage (VSS) terminal, and control the amount of the sinking current SINK_I in response to the enable reference voltage REF_EN applied to the gate thereof. The third current sinking NMOS transistor MN3 is configured to have a drain-source path coupled between the falling determination output node OUT_DN_ND and the ground voltage (VSS) terminal, and control the amount of the sinking current SINK_I in response to the enable reference voltage REF_EN applied to the gate thereof.

The first and second inverters INV1 and INV2 are configured to determine a voltage level of the rising determination output node OUT_UP_ND based on a logic reference level and generate the rising determination signal OUT_UP, and the third and fourth inverters INV3 and INV4 are configured to determine a voltage level of the falling determination output node OUT_DN_ND based on a logic reference level and generate the falling determination signal OUT_DN.

The size ratios of the first current sinking NMOS transistor MN1, the second current sinking NMOS transistor MN2 and the third current sinking NMOS transistor MN3 may be 4:1:1. That is to say, the size of the first current sinking NMOS transistor MN1 should be larger than the sum of the size of the second current sinking NMOS transistor MN2 and the size of the third current sinking NMOS transistor MN3. The reason to this is described when explaining the operation of the level determination part 3462 below.

Figure 4B:
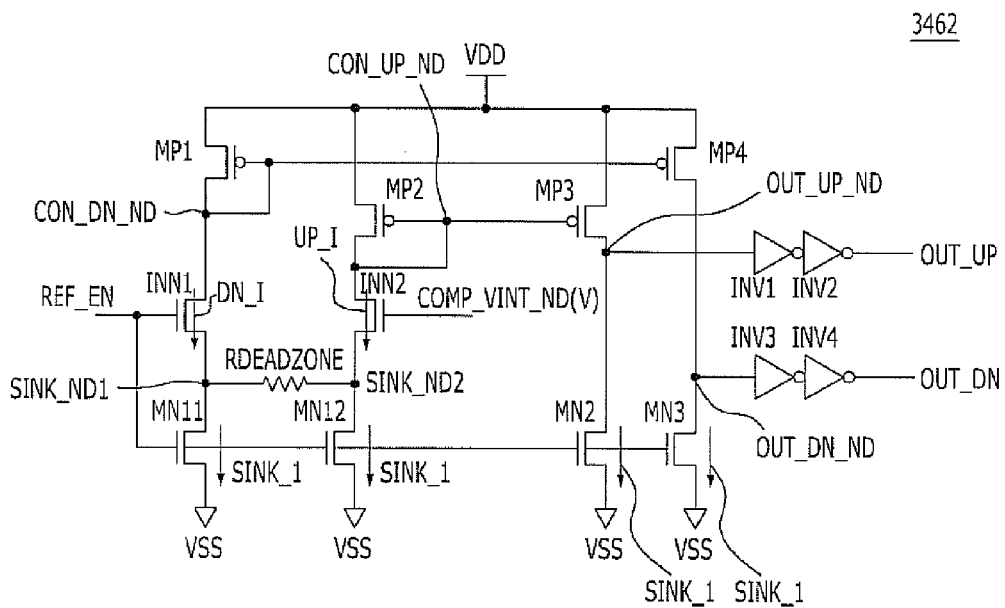

FIG. 4B is a circuit diagram illustrating in detail another embodiment of the level determination part 3462 among the component elements of the circuit according to the second embodiment of the present invention shown in FIG. 3. In FIG. 4B, the elements which are identical with the constituent elements shown in FIG. 4A are assigned the same reference numerals.

Referring to FIG. 4B, the current sinking node SINK_ND, to which the first input NMOS transistor INN1 and the second input NMOS transistor INN2 are commonly connected in the embodiment shown in FIG. 4A, is implemented as a first current sinking node SINK_ND1 which is connected to the first input NMOS transistor INN1 and a second current sinking node SINK_ND2 which is connected to the second input NMOS transistor INN2. A dead zone setting resistor RDEADZONE is additionally provided between the first current sinking node SINK_ND1 and the second current sinking node SINK_ND2.

In detail, the embodiment of the level determination part 3462 shown in FIG. 4B includes first and second input NMOS transistors INN1 and INN2, first to fourth current sinking NMOS transistors MN11 to MN3, the dead zone setting resistor RDEADZONE, first to fourth PMOS transistors MP1 to MP4, and first to fourth inverters INV1 to INV4.

The first input NMOS transistor INN1 is configured to have a drain-source path coupled between a falling determination control node CON_DN_ND and a first current sinking node SINK_ND1, and control amount of falling current DN_I in response to the enable reference voltage REF_EN applied to the gate thereof. The second input NMOS transistor INN2 is configured to have a drain-source path coupled between a rising determination control node CON_UP_ND and a second current sinking node SINK_ND2, and control amount of rising current UP_I in response to the voltage level of the current amount comparison node COMP_VINT_ND applied to the gate thereof.

The first current sinking NMOS transistor MN11 is configured to have a drain-source path coupled between the first current sinking node SINK_ND1 and the ground voltage (VSS) terminal, and control the amount of sinking current SINK_I in response to the enable reference voltage REF_EN applied to the gate thereof. The second current sinking NMOS transistor MN12 is configured to have a drain-source path coupled between the second current sinking node SINK_ND2 and the ground voltage (VSS) terminal, and control the amount of the sinking current SINK_I in response to the enable reference voltage REF_EN applied to the gate thereof. The dead zone setting resistor RDEADZONE is coupled between the first current sinking node SINK_ND1 and the second current sinking node SINK_ND2 and has a predetermined resistance value.

The first and fourth PMOS transistors MP1 and MP4 are connected in a current mirror type between the falling determination control node CON_DN_ND and a falling determination output node OUT_DN_ND, and the second and third PMOS transistors MP2 and MP3 are connected in a current mirror type between the rising determination control node CON_UP_ND and a rising determination output node OUT_UP_ND. The third current sinking NMOS transistor MN2 is configured to have a drain-source path coupled between the rising determination output node OUT_UP_ND and the ground voltage (VSS) terminal, and control the amount of the sinking current SINK_I in response to the enable reference voltage REF_EN applied to the gate thereof. The fourth current sinking NMOS transistor MN4 is configured to have a drain-source path coupled between the falling determination output node OUT_DN_ND and the ground voltage (VSS) terminal, and control the amount of the sinking current SINK_I in response to the enable reference voltage REF_EN applied to the gate thereof.

The first and second inverters INV1 and INV2 are configured to determine the voltage level of the rising determination output node OUT_UP_ND based on a logic reference level and generate the rising determination signal OUT_UP. The third and fourth inverters INV3 and INV4 are configured to determine the voltage level of the falling determination output node OUT_DN_ND based on a logic reference level and generate the falling determination signal OUT_DN.

The size ratios of the first current sinking NMOS transistor MN11, the second current sinking NMOS transistor MN12, the third current sinking NMOS transistor MN2 and the fourth current sinking NMOS transistor MN3 may be 2:2:1:1. That is to say, the sum of the size of the first current sinking NMOS transistor MN11 and the size of the second current sinking NMOS transistor MN12 may be larger than the sum of the size of the third current sinking NMOS transistor MN2 and the size of the fourth current sinking NMOS transistor MN3. The reason to this is described when explaining the operation of the level determination part 3462 below.

Hereinafter, operations of the circuit for generating the internal voltage in the voltage down converting type in the semiconductor device in accordance with the second embodiment of the present invention, configured as mentioned above, is described.

First, the first internal voltage driving unit 300 may operate as long as the power supply voltage VDD is supplied to the semiconductor device. Meanwhile, the plurality of second internal voltage driving units 310A and 310B may operate when the plurality of enable signals ENABLE1 and ENABLE2 are activated in a state in which the power supply voltage VDD is supplied to the semiconductor device, and may not operate when the plurality of enable signals ENABLE1 and ENABLE2 are deactivated.

Accordingly, in a state right after the semiconductor device is initialized, only the first internal voltage driving unit 300 may operate, and the plurality of second internal voltage driving units 310A and 310B may not operate.

Describing the operation of the first internal voltage driving unit 300 in detail, among the component elements of the first internal voltage driving unit 300, the first level comparison section 302 outputs the first detection signal DTEC_VINT1 which is deactivated to a logic high level, when the voltage level of the internal voltage (VINT) output terminal is higher than the level reference voltage REF_VINT, and outputs the first detection signal DTEC_VINT1 which is activated to a logic low level, when the voltage level of the internal voltage (VINT) output terminal is lower than the level reference voltage REF_VINT.

In the first drive current amount control section 304 among the component elements of the first internal voltage driving unit 300, when the output signal of the first level comparison section 302 is deactivated to the logic high level, the amount of the first driving current DRV_I1, which flows from the power supply voltage (VDD) terminal to the internal voltage (VINT) output terminal, becomes '0'. Conversely, when the output signal of the first level comparison section 302 is activated to the logic low level, the amount of the first driving current DRV_I1, which flows from the power supply voltage (VDD) terminal to the internal voltage (VINT) output terminal, is determined in correspondence to the driving force of the first drive current amount control section 304.

For example, if the driving force of the first drive current amount control section 304 corresponds to such an extent that can permit flow of current of approximately maximum '100 mA' from the power supply voltage (VDD) terminal to the internal voltage (VINT) output terminal, the first drive current amount control section 304 may cause current with any one magnitude less than approximately '100 mA' to flow between the power supply voltage (VDD) terminal and the internal voltage (VINT) output terminal, in correspondence to the activation of the output signal of the first level comparison section 302 to the logic low level.

The amount of the current, which flows from the first drive current amount control section 304 to the internal voltage (VINT) output terminal, is used to keep the voltage level of the internal voltage (VINT) output terminal at a predetermined voltage level. Therefore, even though the amount of the current, which flows from the first drive current amount control section 304 to the internal voltage (VINT) output terminal, changes drastically, the voltage level of the internal voltage (VINT) output terminal may not vary substantially.

Meanwhile, in a semiconductor device, the voltage level of the internal voltage (VINT) output terminal may be continuously lower than a target voltage level corresponding to the voltage level of the level reference voltage REF_VINT due to the increasing use of the internal voltage VINT, even though a maximum amount of current capable of being supplied by the first drive current amount control section 304 is supplied to the internal voltage (VINT) output terminal. The circuit for generating an internal voltage in a voltage down converting type in a semiconductor device in accordance with the second embodiment of the present invention senses such a phenomenon and controls the plurality of second internal voltage driving units 310A and 310B to selectively operate depending upon a sensing result, so that the voltage level of the internal voltage (VINT) output terminal is maintained close to the target voltage level.

In detail, the sense sourcing current amount control section 322 among the component elements of the current amount detection unit 320 is controlled in its operation in response to the first detection signal DTEC_VINT1 outputted from the first level comparison section 302 among the component elements of the first internal voltage driving unit 300. That is to say, the sense sourcing current amount control section 322 performs the same operation as the first drive current amount control section 304 among the component elements of the first internal voltage driving unit 300.

Accordingly, the sense sourcing current amount control section 322 controls a specified amount of current to flow from the power supply voltage (VDD) terminal to the current amount sensing node SENS_VINT_ND in response to the activation of the first detection signal DTEC_VINT1 outputted from the first level comparison section 302 to the logic low level. The amount of current which flows between the power supply voltage (VDD) terminal and the current amount sensing node SENS_VINT_ND is determined depending upon the driving force of the sense sourcing current amount control section 322.

For example, if the driving force of the sense sourcing current amount control section 322 corresponds to such an extent that can permit flow of current of approximately maximum '1000 µA' from the power supply voltage (VDD) terminal to the current amount sensing node SENS_VINT_ND, the sense sourcing current amount control section 322 may cause current with any one magnitude less than approximately '1000 µA' to flow between the power supply voltage (VDD) terminal and the current amount sensing node SENS_VINT_ND, in correspondence to the activation of the first detection signal DTEC_VINT1 to the logic low level.

For reference, because the operation purpose of the sense sourcing current amount control section 322 is all the way to detect the amount of current supplied to the internal voltage (VINT) output terminal according to the operation of the first internal voltage driving unit 300, it is not necessary for the sense sourcing current amount control section 322 to have a large driving force like that of the first drive current amount control section 304 disposed in the first internal voltage driving unit 300. In general, as exemplified above, the driving force of the sense sourcing current amount control section 322 may be set to correspond to 1/100 of the driving force of the first drive current amount control section 304.

In this way, in the present embodiment, in a state in which the sense sourcing current amount control section 322 has a driving force smaller, by a specified number of times generally set to 1/100, than the driving force of the first drive current amount control section 304, the sense sourcing current amount control section 322 operates in correspondence to the first detection signal DTEC_VINT1 in a manner similar to the first drive current amount control section 304. Due to this fact, the sense sourcing current SENS_I, with a magnitude that is obtained by decreasing the magnitude of the first driving current DRV_I1 supplied from the power supply voltage (VDD) terminal to the internal voltage (VINT) output terminal through the first drive current amount control section 304, can be supplied from the power supply voltage (VDD) terminal to the current amount sensing node SENS_VINT_ND.

Among the component elements of the current amount comparison unit 340, the comparison sourcing current amount control section 342 controls the reference current with a varying magnitude such as COMP_I1+COMP_I2+COMP_I3, COMP_I1+COMP_I3, or COMP_I1 to flow between the power supply voltage (VDD) terminal and the current amount comparison node COMP_VINT_ND, in response to the current amount reference voltage REF_IV.

The amount of the reference current is determined depending upon the number of enable signals which are activated among the plurality of enable signals ENABLE1 and ENABLE2. That is to say, in a state in which all of the plurality of enable signals ENABLE1 and ENABLE2 are deactivated, the amount of the reference current may correspond to a maximum value of 'COMP_I1+COMP_I2+COMP_I3'. If the first enable signal ENABLE1 is activated and the second enable signal ENABLE2 is deactivated among the plurality of enable signals ENABLE1 and ENABLE2, the amount of the reference current may correspond to an intermediate value of 'COMP_I1+COMP_I3'. If all of the plurality of enable signals ENABLE1 and ENABLE2 are activated, the amount of the reference current may correspond to a minimum value of 'COMP_I1'.

The reason why the amount of the reference current varies depending upon the number of enable signals which are activated among the plurality of enable signals ENABLE1 and ENABLE2 resides in that, even though the first internal voltage driving unit 300 and the plurality of second internal voltage driving units 310A and 310B operate by sharing the one output terminal of the internal voltage VINT, the current amount detection unit 320 detects the amount of only the current DTEC_VINT1 supplied from the power supply voltage (VDD) terminal to the internal voltage (VINT) output terminal according to the operation of the first internal voltage driving unit 300.

That is to say, in the case where all of the plurality of enable signals ENABLE1 and ENABLE2 are deactivated so only the first internal voltage driving unit 300 operates and the plurality of second internal voltage driving units 310A and 310B do not operate, the amount of the sense sourcing current SENS_I detected by the current amount detection unit 320 completely reflects the amount of the entire current supplied to the internal voltage (VINT) output terminal, i.e., the first driving current DRV_I1. Therefore, even when the sense sourcing current SENS_I is compared with the reference current of 'COMP_I1+COMP_I2+COMP_I3' which approaches to its limit value, there is no influence on operational stability.

For example, when the limit value of the sense sourcing current SENS_I detected by the current amount detection unit 320 is approximately '1000 μA', it can be assumed that the limit value of the magnitude of the entire first driving current DRV_I1 supplied to the internal voltage (VINT) output terminal is approximately '100 mA'. Thus, the first driving current DRV_I1 supplied to the internal voltage (VINT) output terminal may be detected based on approximately '80 mA' when the magnitude of the reference current is set to approximately '800 μA'. In this regard, since approximately '80 mA' as the magnitude of the entire current supplied to the internal voltage (VINT) output terminal is not relatively large, a stable operation may be secured.

However, in the case where the first enable signal ENABLE1 is activated and the second enable signal ENABLE2 is deactivated among the plurality of enable signals ENABLE1 and ENABLE2 such that the first internal voltage driving unit 300 and the second internal voltage driving unit 310A operates and the second internal voltage driving unit 310B does not operate among the plurality of second internal voltage driving units 310A and 310B, the magnitude of the sense sourcing current SENS_I detected by the current amount detection unit 320 may reflect approximately 50% of the magnitude of the entire current 'DRV_I1+DRV_I2' supplied to the internal voltage (VINT) output terminal. Therefore, operational stability can be ensured when the magnitude of the reference current as a comparison target with respect to the sense sourcing current SENS_I detected by the current amount detection unit 320 corresponds to 'COMP_I1+COMP_I3' that is slightly larger than the intermediate value of the limit of the sense sourcing current SENS_I detected by the current amount detection unit 320.

In other words, the fact that the magnitude of the sense sourcing current SENS_I detected by the current amount detection unit 320 reflects approximately 50% of the magnitude of the entire current 'DRV_I1+DRV_I2' supplied to the internal voltage (VINT) output terminal means that current with a magnitude corresponding to 2 times of a magnitude presumable by the sense sourcing current SENS_I detected by the current amount detection unit 320 is being supplied from the power supply voltage (VDD) terminal to the internal voltage (VINT) output terminal. Hence, when the magnitude of the reference current as a comparison target with respect to the sense sourcing current SENS_I detected by the current amount detection unit 320 is set to 'COMP_I1+COMP_I3' that is slightly smaller than existing 'COMP_I1+COMP_I2+COMP_I3', it can detect in advance a state in which the magnitude of the entire current 'DRV_I1+DRV_I2' supplied to the internal voltage (VINT) output terminal excessively increases.

For example, in the state in which the magnitude of the sense sourcing current SENS_I detected by the current amount detection unit 320 reflects approximately 50% of the magnitude of the entire current 'DRV_I1+DRV_I2' supplied to the internal voltage (VINT) output terminal, if the magnitude of the reference voltage is maintained to approximately '800 μA' as described above, a comparison operation may be performed based on a standard that the magnitude of the entire current 'DRV_I1+DRV_I2' supplied to the internal voltage (VINT) output terminal exceeds approximately '160 mA'. In this regard, since approximately '160 mA' as the magnitude of the entire current supplied to the internal voltage (VINT) output terminal is a considerably large value, a substantial influence may be exerted in any way on operational stability in the course of performing the comparison operation.

Accordingly, in the state in which the magnitude of the sense sourcing current SENS_I detected by the current amount detection unit 320 reflects approximately 50% of the magnitude of the entire current 'DRV_I1+DRV_I2' supplied to the internal voltage (VINT) output terminal, the magnitude of the reference current may be changed to approximately '600 μA' that is slightly smaller than the existing magnitude, so a comparison operation can be performed based on a standard that the magnitude of the entire current 'DRV_I1+DRV_I2' supplied to the internal voltage (VINT) output terminal exceeds approximately '120 mA', thereby securing operational stability.

Similarly, in the case where all of the plurality of enable signals ENABLE1 and ENABLE2 are activated such that both the first internal voltage driving unit 300 and the plurality of second internal voltage driving units 310A and 310B operate, the magnitude of the sense sourcing current SENS_I detected by the current amount detection unit 320 may reflect approximately 33% of the magnitude of the entire current 'DRV_I1+DRV_I2+DRV_I3' supplied to the internal voltage (VINT) output terminal. Therefore, operational stability can be ensured when the magnitude of the reference current as a comparison target with respect to the sense sourcing current SENS_I detected by the current amount detection unit 320 becomes 'COMP_I1' that is slightly larger than ⅓ of the limit of the sense sourcing current SENS_I detected by the current amount detection unit 320.

In other words, the fact that the magnitude of the sense sourcing current SENS_I detected by the current amount detection unit 320 reflects approximately 33% of the magnitude of the entire current 'DRV_I1+DRV_I2+DRV_I3' supplied to the internal voltage (VINT) output terminal means that current with a magnitude corresponding to 3 times of a magnitude presumable by the sense sourcing current SENS_I detected by the current amount detection unit 320 is being supplied from the power supply voltage (VDD) terminal to the internal voltage (VINT) output terminal. Hence, when the magnitude of the reference current as a comparison target with respect to the sense sourcing current SENS_I detected by the current amount detection unit 320 is set to 'COMP_I1' that is slightly smaller than existing 'COMP_I1+COMP_I3', it can detect in advance a state in which the magnitude of the entire current 'DRV_I1+DRV_I2+DRV_I3' supplied to the internal voltage (VINT) output terminal excessively increases.

For example, in the state in which the magnitude of the sense sourcing current SENS_I detected by the current amount detection unit 320 reflects approximately 33% of the magnitude of the entire current 'DRV_I1+DRV_I2+DRV_I3' supplied to the internal voltage (VINT) output terminal, if the magnitude of the reference voltage is maintained to approximately '600 μA' as described above, a comparison operation may be performed based on a standard that the magnitude of the entire current 'DRV_I1+DRV_I2+DRV_I3' supplied to the internal voltage (VINT) output terminal exceeds approximately '180 mA'. In this regard, since approximately '180 mA' as the magnitude of the entire current supplied to the internal voltage (VINT) output terminal is an absolutely considerably large value, a substantial influence may be exerted in any way on operational stability in the course of performing the comparison operation.

Accordingly, in the state in which the magnitude of the sense sourcing current SENS_I detected by the current amount detection unit 320 reflects approximately 33% of the magnitude of the entire current 'DRV_I1+DRV_I2+DRV_I3' supplied to the internal voltage (VINT) output terminal, the magnitude of the reference current may be changed to approximately '400 μA' that is slightly smaller than the existing magnitude, so a comparison operation can be performed based on a standard that the magnitude of the entire current 'DRV_I1+DRV_I2+DRV_I3' supplied to the internal voltage (VINT) output terminal exceeds approximately '120 mA', thereby securing operational stability.

Among the component elements of the current amount detection unit 320, the level detection section 324 controls the voltage level of the level detection signal DTEC_LV in a manner such that the internal voltage (VINT) output terminal and the current amount sensing node SENS_VINT_ND can have the same voltage level, and thereby, controls the operation of the sense sinking current amount control section 326 among the component elements of the current amount detection unit 320.

For example, in the case where the voltage level of the current amount sensing node SENS_VINT_ND is higher than that of the internal voltage (VINT) output terminal, the voltage level of the level detection signal DTEC_LV which is outputted from the level detection section 324 is raised such that the magnitude of the sense sinking current SINK_SI which flows from the current amount sensing node SENS_VINT_ND to the ground voltage (VSS) terminal increases. Due to this fact, the voltage level of the current amount sensing node SENS_VINT_ND decreases, as a result of which the voltage levels of the internal voltage (VINT) output terminal and the current amount sensing node SENS_VINT_ND become the same with each other.

Similarly, in the case where the voltage level of the current amount sensing node SENS_VINT_ND is lower than that of the internal voltage (VINT) output terminal, the voltage level of the level detection signal DTEC_LV which is outputted from the level detection section 324 is lowered such that the magnitude of the sense sinking current SINK_SI which flows from the current amount sensing node SENS_VINT_ND to the ground voltage (VSS) terminal decreases. Due to this fact, the voltage level of the current amount sensing node SENS_VINT_ND increases, as a result of which the voltage levels of the internal voltage (VINT) output terminal and the current amount sensing node SENS_VINT_ND become the same with each other.

The level detection section 324 among the component elements of the current amount detection unit 320 controls the operation of the sense sinking current amount control section 326 in the way as described above, and at the same time controls the operation of the comparison sinking current amount control section 344 among the component elements of the current amount comparison unit 340.

Namely, in a situation where the operation of the sense sinking current amount control section 326 is controlled in such a manner that the magnitude of the sense sinking current SINK_SI flowing from the current amount sensing node SENS_VINT_ND to the ground voltage (VSS) terminal increases, the operation of the comparison sinking current amount control section 344 is controlled in such a manner that the magnitude of the compare sinking current SINK_CI flowing from the current amount comparison node COMP_VINT_ND to the ground voltage (VSS) terminal also increases.

As the level detection section 324 simultaneously controls the operations of the sense sinking current amount control section 326 and the comparison sinking current amount control section 344 in this way, the amounts of current which is sunk in the current amount sensing node SENS_VINT_ND and the current amount comparison node COMP_VINT_ND are always the same with each other. Conversely, due to the fact that the magnitude of the sense sourcing current SENS_I supplied to the current amount sensing node SENS_VINT_ND by the first detection signal DTEC_VINT1 changes and the magnitude of the reference current such as COMP_I1+COMP_I2+COMP_I3, COMP_I1+COMP_I3, or COMP_I1 supplied to the current amount comparison node COMP_VINT_ND by the comparison sourcing current amount control section 342 is fixed (since the magnitude of the reference current changes in correspondence to the plurality of enable signals ENABLE1 and ENABLE2, it may be considered to be in a fixed state), the voltage level of the current amount comparison node COMP_VINT_ND changes depending upon the relationship between the magnitude of the sense sourcing current SENS_I supplied to the current amount sensing node SENS_VINT_ND and the magnitude of the reference current such as COMP_I1+COMP_I2+COMP_I3, COMP_I1+COMP_I3, or COMP_I1 supplied to the current amount comparison node COMP_VINT_ND.

For example, in the case where the magnitude of the sense sourcing current SENS_I supplied to the current amount sensing node SENS_VINT_ND is less than the magnitude of the reference current such as COMP_I1+COMP_I2+COMP_I3, COMP_I1+COMP_I3, or COMP_I1 supplied to the current amount comparison node COMP_VINT_ND, the amount of current sunk from the current amount comparison node COMP_VINT_ND to the ground voltage (VSS) terminal is smaller than the amount of current supplied from the power supply voltage (VDD) terminal to the current amount comparison node COMP_VINT_ND. The voltage level of the current amount comparison node COMP_VINT_ND increases.

Conversely, in the case where the magnitude of the sense sourcing current SENS_I supplied to the current amount sensing node SENS_VINT_ND is greater than the magnitude of the reference current such as COMP_I1+COMP_I2+COMP_I3, COMP_I1+COMP_I3, or COMP_I1 supplied to the current amount comparison node COMP_VINT_ND, the amount of current sunk from the current amount comparison node COMP_VINT_ND to the ground voltage (VSS) terminal is larger than the amount of current supplied from the power supply voltage (VDD) terminal to the current amount comparison node COMP_VINT_ND. The voltage level of the current amount comparison node COMP_VINT_ND decreases.

As described above, the level detection section 324 among the component elements of the current amount detection unit 320 plays a very important role of keeping the amounts of current sunk in the current amount sensing node SENS_VINT_ND and the current amount comparison node COMP_VINT_ND the same with each other. Such a role may be replaced by the configuration of a current mirroring circuit shown in FIG. 7.

Figure 7:
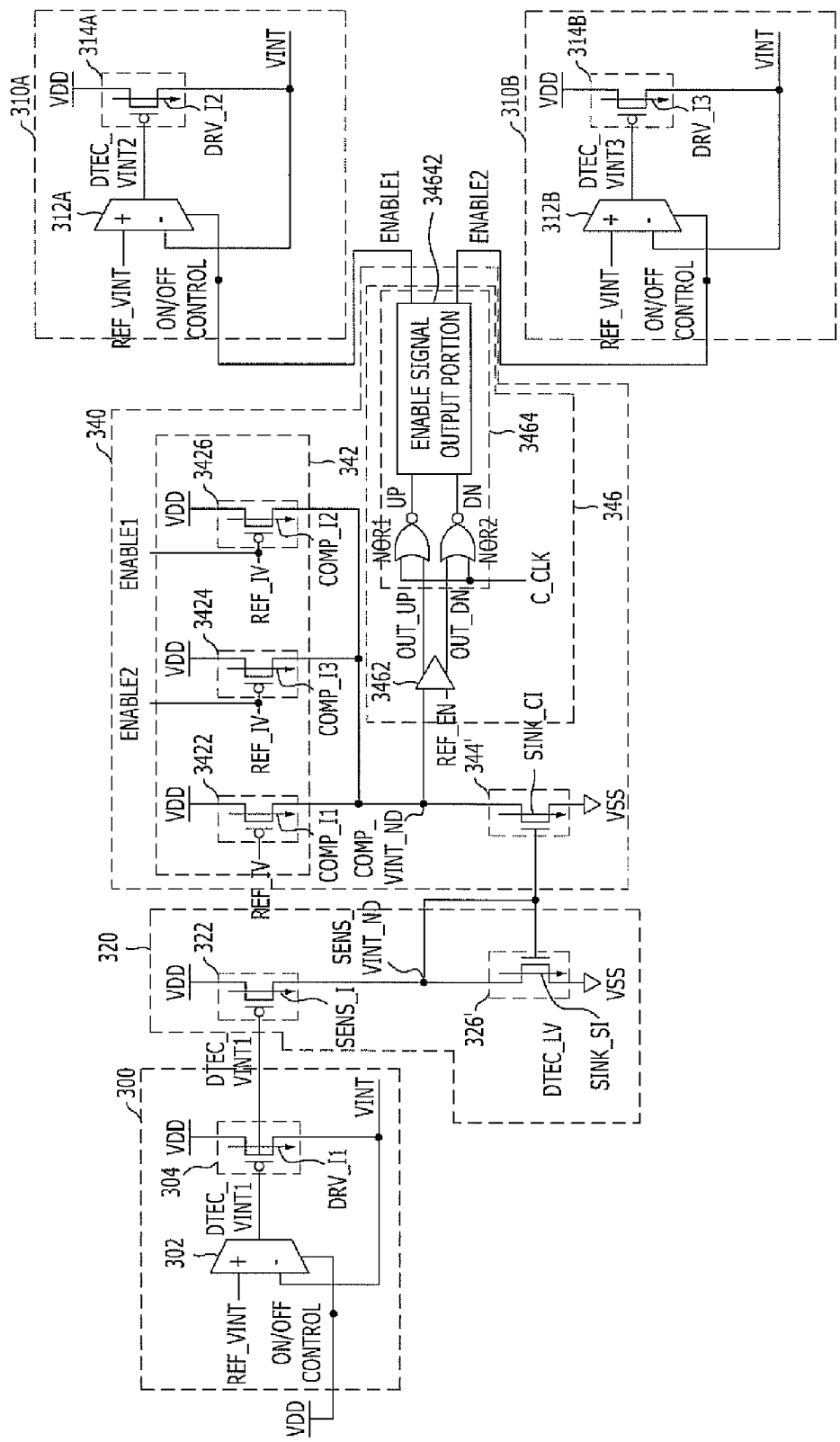
FIG. 7 is a block diagram for comparatively explaining the cases where a level detection section exists and does not exist in the circuit for generating the internal voltage in the voltage down converting type according to the second embodiment of the present invention shown in FIG. 3.

That is to say, referring to FIG. 7, the configuration of the current amount detection unit 320 can be modified to a type including a sense sourcing current amount control section 322 configured to control the magnitude of the sense sourcing current SENS_I which flows from the power supply voltage (VDD) terminal to the current amount sensing node SENS_VINT_ND, in response to the first detection signal DTEC_VINT1, and a sense sinking current amount control section 326' configured to control the magnitude of the sense sinking current SINK_SI which flows from the current amount sensing node SENS_VINT_ND to the ground voltage (VSS) terminal, depending upon the voltage level of the current amount sensing node SENS_VINT_ND.

Similarly, the configuration of the current amount comparison unit 340 can be modified to a type including a comparison sourcing current amount control section 342 configured to control current with the amount of the reference current such as COMP_I1+COMP_I2+COMP_I3, COMP_I1+COMP_I3, or COMP_I1 to flow between the power supply voltage (VDD) terminal and the current amount comparison node COMP_VINT_ND, in response to the current amount reference voltage REF_IV and the plurality of enable signals ENABLE1 and ENABLE2, a comparison sinking current amount control section 344' configured to control the magnitude of compare sinking current SINK_CI which flows from the current amount comparison node COMP_VINT_ND to the ground voltage (VSS) terminal, depending upon the voltage level of the current amount sensing node SENS_VINT_ND, and an enable signal generation section 346 configured to generate the plurality of enable signals ENABLE1 and ENABLE2 of which activation or deactivation is determined in response to the voltage level of the current amount comparison node COMP_VINT_ND.

Since the circuit for generating an internal voltage in a voltage down converting type in a semiconductor device in accordance with the second embodiment of the present invention is configured as shown in FIG. 7, the configuration may be simplified and the area occupied by the circuit may decrease, thereby reducing current consumption.

On the other hand, the voltage level of the internal voltage (VINT) output terminal and the voltage level of the current amount sensing node SENS_VINT_ND may deviate from each other as the operation of the semiconductor device continues, and owing to this fact, the magnitude of the current detected by the current amount detection unit 320 may not properly reflect the magnitude of the first driving current DRV_I1 supplied from the power supply voltage (VDD) terminal to the internal voltage (VINT) output terminal according to the operation of the first internal voltage driving unit 300.

Nevertheless, since all the characterizing features of the prevent invention can be realized not only by the internal voltage generation circuit of the type shown in FIG. 3 but also by the internal voltage generation circuit of the type shown in FIG. 7, the internal voltage generation circuit of the type shown in FIG. 7 of course falls under the scope of the present invention.

The level determination part 3462 provided in the enable signal generation section 346 among the component elements of the current amount comparison unit 340 activates and outputs the rising determination signal OUT_UP and deactivates and outputs the falling determination signal OUT_DN when the voltage level of the current amount comparison node COMP_VINT_ND is higher than the voltage level of the enable reference voltage REF_EN by a predefined voltage level. The level determination part 3462 deactivates and outputs the rising determination signal OUT_UP and activates and outputs the falling determination signal OUT_DN when the voltage level of the current amount comparison node COMP_VINT_ND is lower than the voltage level of the enable reference voltage REF_EN by the predefined voltage level. The level determination part 3462 activates and outputs both the rising determination signal OUT_UP and the falling determination signal OUT_DN when the difference between the voltage level of the current amount comparison node COMP_VINT_ND and the voltage level of the enable reference voltage REF_EN is less than the predefined voltage level.

Describing the operation of the level determination part 3462 in detail with reference to FIGS. 4A and 4B, in the case where the voltage level of the enable reference voltage REF_EN, which is inputted to the first input NMOS transistor INN1, is higher by the predefined voltage level than the voltage level of the current amount comparison node COMP_VINT_ND, which is inputted to the second input NMOS transistor INN2, the voltage level of the falling determination control node CON_DN_ND decreases, and the voltage level of the rising determination control node CON_UP_ND increases.

If the voltage level of the falling determination control node CON_DN_ND decreases, the voltage level of the falling determination output node OUT_DN_ND, which is in a current mirroring relationship, increases, and if the voltage level of the rising determination control node CON_UP_ND increases, the voltage level of the rising determination output node OUT_UP_ND, which is in a current mirroring relationship, decreases.

In this regard, if the voltage level of the falling determination output node OUT_DN_ND increases beyond the logic reference level, the falling determination signal OUT_DN is activated to a logic high level in response to that, and if the voltage level of the rising determination output node OUT_UP_ND decreases below the logic reference level, the rising determination signal OUT_UP is deactivated to a logic low level in response to that.

Conversely, in the case where the voltage level of the enable reference voltage REF_EN, which is inputted to the first input NMOS transistor INN1, is lower by the predefined voltage level than the voltage level of the current amount comparison node COMP_VINT_ND, which is inputted to the second input NMOS transistor INN2, the voltage level of the falling determination control node CON_DN_ND increases, and the voltage level of the rising determination control node CON_UP_ND decreases.

If the voltage level of the falling determination control node CON_DN_ND increases, the voltage level of the falling determination output node OUT_DN_ND, which is in a current mirroring relationship, decreases, and if the voltage level of the rising determination control node CON_UP_ND decreases, the voltage level of the rising determination output node OUT_UP_ND, which is in a current mirroring relationship, increases.

In this regard, if the voltage level of the falling determination output node OUT_DN_ND decreases below the logic reference level, the falling determination signal OUT_DN is deactivated to the logic low level in response to that, and if the voltage level of the rising determination output node OUT_UP_ND increases beyond the logic reference level, the rising determination signal OUT_UP is activated to the logic high level in response to that.

In the case where the difference between the voltage level of the enable reference voltage REF_EN, which is inputted to the first input NMOS transistor INN1, and the voltage level of the current amount comparison node COMP_VINT_ND, which is inputted to the second input NMOS transistor INN2, is less than the predefined voltage level, the voltage level of the falling determination control node CON_DN_ND and the voltage level of the rising determination control node CON_UP_ND become similar to each other, and in this state, the voltage level of any one node does not increase or decrease.

In the embodiment of the level determination part 3462 shown in FIG. 4A, because the size of the first current sinking NMOS transistor MN1 for sinking current from the rising determination control node CON_UP_ND and the falling determination control node CON_DN_ND is larger than the sum of the size of the second current sinking NMOS transistor MN2 and the third current sinking NMOS transistor MN3, even though both the falling determination control node CON_DN_ND and the rising determination control node CON_UP_ND have voltage levels of which logic levels are difficult to determine, the voltage levels of the falling determination output node OUT_DN_ND and the rising determination output node OUT_UP_ND, which form current mirrors with respect to the falling determination control node CON_DN_ND and the rising determination control node CON_UP_ND, can be increased to the extent that they can be determined to have a logic high level. Namely, the voltage levels of the falling determination output node OUT_DN_ND and the rising determination output node OUT_UP_ND may be maintained to be higher than the logic reference level.

Accordingly, in the case where the difference between the voltage level of the enable reference voltage REF_EN, which is inputted to the first input NMOS transistor INN1, and the voltage level of the current amount comparison node COMP_VINT_ND, which is inputted to the second input NMOS transistor INN2, is less than the predefined voltage level, the falling determination signal OUT_DN corresponding to the falling determination output node OUT_DN_ND is activated to the logic high level, and the rising determination signal OUT_UP corresponding to the rising determination output node OUT_UP_ND is activated to the logic high level.

In the embodiment of the level determination part 3462 shown in FIG. 4B, because the sum of the size of the first current sinking NMOS transistor MN11 and the size of the second current sinking NMOS transistor MN12 for sinking current from the rising determination control node CON_UP_ND and the falling determination control node CON_DN_ND is larger than the sum of the size of the third current sinking NMOS transistor MN2 and the fourth current sinking NMOS transistor MN3, even though both the falling determination control node CON_DN_ND and the rising determination control node CON_UP_ND have voltage levels of which logic levels are difficult to determine, the voltage levels of the falling determination output node OUT_DN_ND and the rising determination output node OUT_UP_ND, which form current mirrors with respect to the falling determination control node CON_DN_ND and the rising determination control node CON_UP_ND, can be increased to the extent that they can be determined to have a logic high level. Namely, the voltage levels of the falling determination output node OUT_DN_ND and the rising determination output node OUT_UP_ND may be maintained in a state in which they are higher than the logic reference level.

Accordingly, in the case where the difference between the voltage level of the enable reference voltage REF_EN, which is inputted to the first input NMOS transistor INN1, and the voltage level of the current amount comparison node COMP_VINT_ND, which is inputted to the second input NMOS transistor INN2, is less than the predefined voltage level, the falling determination signal OUT_DN corresponding to the falling determination output node OUT_DN_ND is activated to the logic high level, and the rising determination signal OUT_UP corresponding to the rising determination output node OUT_UP_ND is activated to the logic high level as well.

Distinguishing operations between when adopting the level determination part 3462 shown in FIG. 4A and when adopting the level determination part 3462 shown in FIG. 4B, the additional dead zone setting resistor RDEADZONE is further provided in order that a period corresponding to a case in which the voltage level of the current amount comparison node COMP_VINT_ND is higher than the voltage level of the enable reference voltage REF_EN by the predefined voltage level, a period corresponding to a case in which the voltage level of the current amount comparison node COMP_VINT_ND is lower than the voltage level of the enable reference voltage REF_EN by the predefined voltage level, and a period corresponding to a case in which the difference between the voltage level of the current amount comparison node COMP_VINT_ND and the voltage level of the enable reference voltage REF_EN is less than the predefined voltage level are clearly distinguished from one another.

That is to say, in the embodiment of the level determination part 3462 shown in FIG. 4A, variations in the voltage levels of the rising determination output node OUT_UP_ND and the falling determination output node OUT_DN_ND linearly occur in correspondence to variations in the voltage level of the current amount comparison node COMP_VINT_ND rather than the voltage level of the enable reference voltage REF_EN. Accordingly, boundaries for dividing the period corresponding to the case in which the voltage level of the current amount comparison node COMP_VINT_ND is higher than the voltage level of the enable reference voltage REF_EN by the predefined voltage level, the period corresponding to the case in which the voltage level of the current amount comparison node COMP_VINT_ND is lower than the voltage level of the enable reference voltage REF_EN by the predefined voltage level, and the period corresponding to the case in which the difference between the voltage level of the current amount comparison node COMP_VINT_ND and the voltage level of the enable reference voltage REF_EN is less than the predefined voltage level may be unclearly defined.

However, in the embodiment of the level determination part 3462 shown in FIG. 4B, variations in the voltage levels of the rising determination output node OUT_UP_ND and the falling determination output node OUT_DN_ND occur in the form of a quadratic function in correspondence to variations in the voltage level of the current amount comparison node COMP_VINT_ND rather than the voltage level of the enable reference voltage REF_EN. Accordingly, boundaries for dividing the period corresponding to the case in which the voltage level of the current amount comparison node COMP_VINT_ND is higher than the voltage level of the enable reference voltage REF_EN by the predefined voltage level, the period corresponding to the case in which the voltage level of the current amount comparison node COMP_VINT_ND is lower than the voltage level of the enable reference voltage REF_EN by the predefined voltage level, and the period corresponding to the case in which the difference between the voltage level of the current amount comparison node COMP_VINT_ND and the voltage level of the enable reference voltage REF_EN is less than the predefined voltage level can be clearly defined.

Because of this difference, in the circuit for generating an internal voltage in a voltage down converting type in a semiconductor device in accordance with the second embodiment of the present invention, although the level determination part 3462 shown in FIG. 4A can be used, the level determination part 3462 shown in FIG. 4B may be mainly used.

In the activation control part 3464 provided to the enable signal generation section 346 among the component elements of the current amount comparison unit 340, in a state in which both the rising determination signal OUT_UP and the falling determination signal OUT_DN are activated to the logic high level, if the falling determinations signal OUT_DN maintains the state activated to the logic high level and the rising determination signal OUT_UP changes to a state deactivated to the logic low level, the rising control signal UP toggles every time the control clock C_CLK toggles, and the falling control signal DN maintains the deactivated state as it is. Therefore, among the plurality of enable signals ENABLE1 and ENABLE2, signals in deactivated states are sequentially activated one by one.

In other words, when the voltage level of the current amount comparison node COMP_VINT_ND becomes lower than the voltage level of the enable reference voltage REF_EN by the predefined voltage level from the state in which the difference between the voltage level of the enable reference voltage REF_EN and the voltage level of the current amount comparison node COMP_VINT_ND is less than the predefined voltage level, signals in deactivated states among the plurality of enable signals ENABLE1 and ENABLE2 are sequentially activated one by one every time the control clock C_CLK toggles.

Conversely, in a state in which both the rising determination signal OUT_UP and the falling determination signal OUT_DN are activated to the logic high level, if the rising determinations signal OUT_UP maintains the state activated to the logic high level and the falling determination signal OUT_DN changes to the state deactivated to the logic low level, the rising control signal UP maintains the deactivated state as it is, and the falling control signal DN toggles every time the control clock C_CLK toggles. Therefore, among the plurality of enable signals ENABLE1 and ENABLE2, signals in activated states are sequentially deactivated one by one.

In other words, when the voltage level of the current amount comparison node COMP_VINT_ND becomes higher than the voltage level of the enable reference voltage REF_EN by the predefined voltage level from the state in which the difference between the voltage level of the enable reference voltage REF_EN and the voltage level of the current amount comparison node COMP_VINT_ND is less than the predefined voltage level, signals in activated states among the plurality of enable signals ENABLE1 and ENABLE2 are sequentially deactivated one by one every time the control clock C_CLK toggles.

Figure 5:
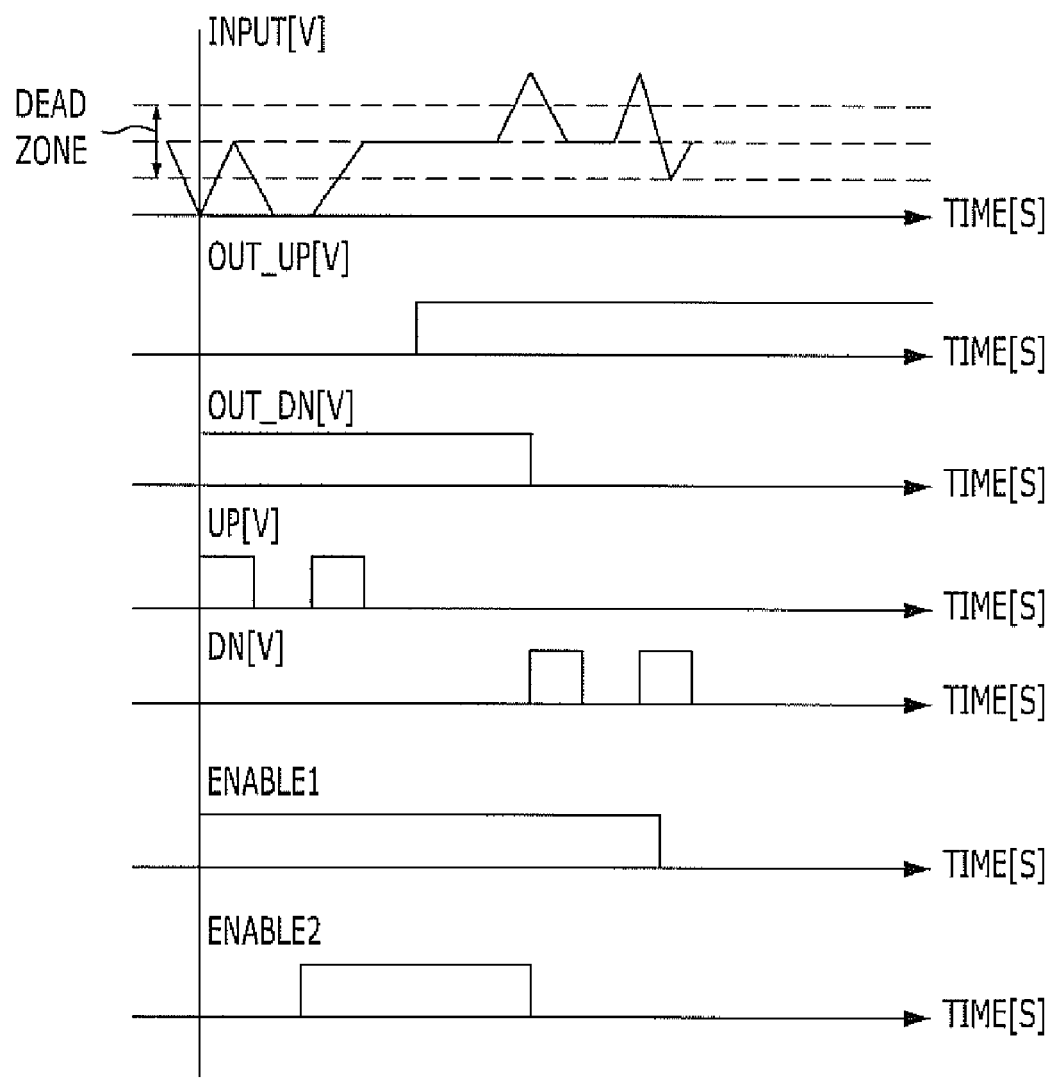
FIG. 5 is a timing diagram illustrating operations of an enable signal generation section among the component elements of the circuit for generating the internal voltage in the voltage down converting type according to the second embodiment of the present invention shown in FIG. 3.

FIG. 5 is a timing diagram illustrating operations of the enable signal generation section 346 among the component elements of the circuit for generating the internal voltage in the voltage down converting type according to the second embodiment of the present invention shown in FIG. 3.

Referring to FIG. 5, in the enable signal generation section 346 among the component elements of the circuit for generating the internal voltage in the voltage down converting type in the semiconductor device in accordance with the second embodiment of the present invention, in the state in which the difference between the voltage level of the enable reference voltage REF_EN and the voltage level of the current amount comparison node COMP_VINT_ND is less than the predefined voltage level (that is, in a dead zone), if the voltage level of the current amount comparison node COMP_VINT_ND decreases to be lower than the voltage level of the enable reference voltage REF_EN by the predefined voltage level, the rising determination signal OUT_UP is deactivated to the logic low level and the falling determination signal OUT_DN is activated to the logic high level in response to that.

In this state, the rising control signal UP implements first toggling in response to a toggling of the control clock C_CLK. Accordingly, among the plurality of enable signals ENABLE1 and ENABLE2 all of which are kept deactivated to the logic low level, the first enable signal ENABLE1 is activated to the logic high level.

In this way, as the first enable signal ENABLE1 is activated to the logic high level, the difference between the voltage level of the enable reference voltage REF_EN and the voltage level of the current amount comparison node COMP_VINT_ND returns to the state in which it is less than the predefined voltage level, but this state may not be maintained for a long time and the voltage level of the current amount comparison node COMP_VINT_ND may decrease to be lower than the voltage level of the enable reference voltage REF_EN by the predefined voltage level. At this time, since the rising determination signal OUT_UP was deactivated to the logic low level and the falling determination signal OUT_DN was activated to the logic high level in the previous state, the logic levels of the rising determination signal OUT_UP and the falling determination signal OUT_DN are not changed.

Nevertheless, because the control clock C_CLK continuously toggles during the period in which the rising determination signal OUT_UP is deactivated to the logic low level and the falling determination signal OUT_DN is activated to the logic high level, the rising control signal UP implements second toggling. Accordingly, among the plurality of enable signals ENABLE1 and ENABLE2, even the second enable signal ENABLE2 which has been maintained in the state deactivated to the logic low level is activated to the logic high level.

In this way, as even the second enable signal ENABLE2 is activated to the logic high level following the first enable signal ENABLE1, the difference between the voltage level of the enable reference voltage REF_EN and the voltage level of the current amount comparison node COMP_VINT_ND returns again to the state in which it is less than the predefined voltage level (that is, enters the dead zone). In response to that, the rising determination signal OUT_UP, which was deactivated to the logic low level in the previous state, changes to have the logic high level, and the falling determination signal OUT_DN, which was activated to the logic high level in the previous state, maintains the state activated to the logic high level as it is.

In this way, as both the rising determination signal OUT_UP and the falling determination signal OUT_DN are activated to the logic high level, even though the control clock C_CLK continuously toggles, the rising control signal UP and the falling control signal DN do not toggle any more.

Thereafter, in the state in which the difference between the voltage level of the enable reference voltage REF_EN and the voltage level of the current amount comparison node COMP_VINT_ND is less than the predefined voltage level (that is, in the dead zone), if the voltage level of the current amount comparison node COMP_VINT_ND increases to be higher than the voltage level of the enable reference voltage REF_EN by the predefined voltage level, the rising determination signal OUT_UP is activated to the logic high level and the falling determination signal OUT_DN is deactivated to the logic low level in response to that.

In this state, the falling control signal DN implements first toggling in response to toggling of the control clock C_CLK. Accordingly, among the plurality of enable signals ENABLE1 and ENABLE2 all of which are kept activated to the logic high level, the second enable signal ENABLE2 is deactivated to the logic low level.

In this way, as the second enable signal ENABLE2 is deactivated to the logic low level, the difference between the voltage level of the enable reference voltage REF_EN and the voltage level of the current amount comparison node COMP_VINT_ND returns to the state in which it is less than the predefined voltage level (that is, enters the dead zone), but this state may not be maintained for a long time and the voltage level of the current amount comparison node COMP_VINT_ND may increase to be higher than the voltage level of the enable reference voltage REF_EN by the predefined voltage level. At this time, since the falling determination signal OUT_DN was deactivated to the logic low level and the rising determination signal OUT_UP was activated to the logic high level in the previous state, the logic levels of the rising determination signal OUT_UP and the falling determination signal OUT_DN are not changed.

Nevertheless, because the control clock C_CLK continuously toggles during the period in which the falling determination signal OUT_DN is deactivated to the logic low level and the rising determination signal OUT_UP is activated to the logic high level, the falling control signal DN implements second toggling. Accordingly, among the plurality of enable signals ENABLE1 and ENABLE2, even the first enable signal ENABLE1 which has been maintained in the state activated to the logic high level is deactivated to the logic low level.

In this way, as even the first enable signal ENABLE1 is deactivated to the logic low level following the second enable signal ENABLE2, the difference between the voltage level of the enable reference voltage REF_EN and the voltage level of the current amount comparison node COMP_VINT_ND returns again to the state in which it is less than the predefined voltage level (that is, enters the dead zone). In response to that, the falling determination signal OUT_DN, which was deactivated to the logic low level in the previous state, changes to have the logic high level, and the rising determination signal OUT_UP, which was activated to the logic high level in the previous state, maintains the state activated to the logic high level as it is.

In this way, as both the rising determination signal OUT_UP and the falling determination signal OUT_DN are activated to the logic high level, even though the control clock C_CLK continuously toggles, the rising control signal UP and the falling control signal DN do not toggle any more.

The operation of the enable signal generation section 346 configured as mentioned above is described below in the light of the operation of the current amount detection unit 320 and the current amount comparison unit 340. Every time the amount of the sense sourcing current SENS_I detected by the current amount detection unit 320 as the amount of current supplied from the power supply voltage (VDD) terminal to the current amount sensing node SENS_VINT_ND has a magnitude smaller than the amount of reference current COMP_I1+COMP_I2+COMP_I3, COMP_I1+COMP_I3, or COMP_I1 corresponding to the current amount comparison unit 340 as the amount of current supplied from the power supply voltage (VDD) terminal to the current amount comparison node COMP_VINT_ND, enable signals which are in the activated state among the plurality of enable signals ENABLE1 and ENABLE2 are outputted by being sequentially deactivated. In other words, among the plurality of second internal voltage driving units 310A and 310B, the number of second internal voltage driving units which stop driving the output terminal of the internal voltage increases one by one. Accordingly, the number of entire driving units which drive the internal voltage (VINT) output terminal, corresponding to the sum of the first internal voltage driving unit 300 and the second internal voltage driving units 310A and 310B which perform operations, decreases. Nonetheless, because there is no problem for the voltage level of the internal voltage (VINT) output terminal to maintain the target voltage level corresponding to the voltage level of the level reference voltage REF_VINT, the semiconductor device may operate normally.

Conversely, every time the amount of the sense sourcing current SENS_I detected by the current amount detection unit 320 as the amount of current supplied from the power supply voltage (VDD) terminal to the current amount sensing node SENS_VINT_ND has a magnitude larger than the amount of reference current COMP_I1+COMP_I2+COMP_I3, COMP_I1+COMP_I3, or COMP_I1 corresponding to the current amount comparison unit 340 as the amount of current supplied from the power supply voltage (VDD) terminal to the current amount comparison node COMP_VINT_ND, enable signals which are in the deactivated state among the plurality of enable signals ENABLE1 and ENABLE2 are outputted by being sequentially activated. In other words, among the plurality of second internal voltage driving units 310A and 3108, the number of second internal voltage driving units which begin driving the output terminal of the internal voltage increases one by one. Accordingly, the number of entire driving units which drive the internal voltage (VINT) output terminal, corresponding to the sum of the first internal voltage driving unit 300 and the second internal voltage driving units 310A and 3108 which perform the operations, increases. Of course, because there is no problem for the voltage level of the internal voltage (VINT) output terminal to maintain the target voltage level corresponding to the voltage level of the level reference voltage REF_VINT, the semiconductor device may operate normally.

For reference, in the plurality of enable signals ENABLE1 and ENABLE2, a sequence in which signals in the deactivated state are activated and a sequence in which signals in the activated state are deactivated can be set in advance by a designer.

As described above, in the circuit for generating an internal voltage in a voltage down converting type in a semiconductor device in accordance with the second embodiment of the present invention, in the state where the first internal voltage driving unit 300, which operates at the same time power is supplied to the semiconductor device, is provided, the plurality of second internal voltage driving units 310A and 310B, which are configured to detect the amount of current supplied from the power supply voltage (VDD) terminal to the internal voltage (VINT) output terminal according to the operation of the first internal voltage driving unit 300 and are controlled in their on/off operations in correspondence to a detection result, are additionally provided.

Through this, when the internal voltage VINT is consumed to a level exceeding a amount of current capable of being supplied by the first internal voltage driving unit 300 in the semiconductor device, the plurality of second internal voltage driving units 310A and 310B can be operated. That is to say, it can keep the amount of current consumed due to the use of the internal voltage VINT in the semiconductor device at a minimum level.

Further, as the amount of current to be consumed due to the use of the internal voltage VINT in the semiconductor device increases, it can be controlled that the number of the second internal voltage driving units for driving the internal voltage (VINT) output terminal among the plurality of second internal voltage driving units 310A and 310B increases. Therefore, even when the amount of current to be consumed due to the use of the internal voltage VINT in the semiconductor device increases over the predefined level, the semiconductor device can be supported in such a situation.

Moreover, since a degree to which the internal voltage VINT is consumed in the semiconductor device can be more accurately measured than relying on the experience/prediction of a designer and an inaccurate simulation as in the conventional art, measurement details can be taken into consideration when subsequently designing a semiconductor device, so that a semiconductor device with a reduced entire area of an internal voltage generation circuit can be realized.

As is apparent from the above description, in the present invention, each of a plurality of internal voltage generation circuits is configured to be divided into a first internal voltage generation unit which is directly controlled in its operation by an external command, and a second internal voltage generation unit which is controlled in its operation in correspondence to a result of detecting the amount of current supplied to a terminal of an internal voltage by the operation of the first internal voltage generation unit. Due to this fact, in the internal voltage generation circuit, the second internal voltage generation unit can be controlled in its operation depending upon the amount of current consumed due to the use of the internal voltage in a semiconductor device.

Through this, the amount of current consumed due to the use of the internal voltage can be determined to a minimum manner.

While the present invention has been described with respect to the specific embodiments, it will be apparent to those skilled in the art that various changes and modifications may be made without departing from the spirit and scope of the invention as defined in the following claims.

For example, while the aforementioned embodiment was described as if the plurality of second internal voltage driving units 310A and 310B are composed of two driving units, this is only for the sake of convenience in explanation. Thus, the plurality of second internal voltage driving units can include driving units the number of which is less or more than 2, and as a matter of course, this case falls under the scope of the present invention.

Similarly, while the aforementioned embodiment was described as if the plurality of enable signals ENABLE1 and ENABLE2 are composed of two enable signals, this is only for the sake of convenience in explanation. Thus, the plurality of enable signals can include enable signals the number of which is less or more than 2, and as a matter of course, this case falls under the scope of the present invention.

Further, the logic gates and transistors exemplified in the aforementioned embodiments should be realized to have different positions and kinds depending upon the polarities of input signals.

What is claimed is:

1. A semiconductor device comprising:
    a first internal voltage driving unit configured to drive an internal voltage in response to a power supply voltage;
    a second internal voltage driving unit configured to drive the internal voltage in response to an enable signal;
    a current amount detection unit configured to detect amount of current supplied by the first internal voltage driving unit; and
    a current amount comparison unit configured to compare the amount of detected current by the current amount detection unit with amount of a reference current, and determine whether or not to activate the enable signal in response to a comparison result.

2. The semiconductor device of claim 1, wherein the current amount comparison unit deactivates the enable signal when the amount of the detected current is smaller than the amount of the reference current, and activates the enable signal when the amount of the detected current is larger than the amount of the reference current.

3. The semiconductor device of claim 1, wherein the first internal voltage driving unit comprises:
    a first level comparison section configured to compare a voltage level of the internal voltage with a voltage level of a level reference voltage; and
    a first drive sourcing current amount control section configured to control amount of current flowing from a terminal of a power supply voltage to an output terminal of the internal voltage in response to an output signal of the first level comparison section.

4. The semiconductor device of claim 3, wherein the second internal voltage driving unit comprises:
   a second level comparison section configured to be controlled in its on/off operation in response to the enable signal, and compare the voltage level of the internal voltage with the voltage level of the level reference voltage; and
   a second drive sourcing current amount control section configured to control amount of current flowing from the terminal of the power supply voltage to the output terminal of the internal voltage in response to an output signal of the second level comparison section.

5. The semiconductor device of claim 4, wherein the current amount detection unit comprises:
   a sense sourcing current amount control section configured to control amount of current flowing from the terminal of the power supply voltage to a current amount sensing node in response to the output signal of the first level comparison section;
   a level detection section configured to detect a difference in voltage level between the output terminal of the internal voltage and the current amount sensing node; and
   a sense sinking current amount control section configured to control amount of current flowing from the current amount sensing node to a terminal of a ground voltage, in response to an output signal of the level detection section.

6. The semiconductor device of claim 5, wherein the current amount comparison unit comprises:
   a comparison sourcing current amount control section configured to control the reference current with a reference amount to flow between the terminal of the power supply voltage and a current amount comparison node in response to a current amount reference voltage;
   a comparison sinking current amount control section configured to control amount of current flowing from the current amount comparison node to the terminal of the ground voltage in response to the output signal of the level detection section; and
   an enable signal generation section configured to generate the enable signal of which activation or deactivation is determined in response to a voltage level of the current amount comparison node.

7. The semiconductor device of claim 4, wherein the current amount detection unit comprises:
   a sense sourcing current amount control section configured to control amount of current flowing from the terminal of the power supply voltage to a current amount sensing node in response to the output signal of the first level comparison section; and
   a sense sinking current amount control section configured to control amount of current flowing from the current amount sensing node to a terminal of a ground voltage, depending upon a voltage level of the current amount sensing node.

8. The semiconductor device of claim 7, wherein the current amount comparison unit comprises:
   a comparison sourcing current amount control section configured to control the reference current with a reference amount to flow between the terminal of the power supply voltage and a current amount comparison node in response to a current amount reference voltage;
   a comparison sinking current amount control section configured to control amount of current flowing from the current amount comparison node to the terminal of the ground voltage depending upon the voltage level of the current amount sensing node; and
   an enable signal generation section configured to generate the enable signal of which activation or deactivation is determined in response to a voltage level of the current amount comparison node.

9. The semiconductor device of claim 8, wherein the enable signal generation section activates the enable signal when the voltage level of the current amount comparison node becomes lower than a predetermined voltage level, and deactivates the enable signal when the voltage level of the current amount comparison node becomes higher than the predetermined voltage level.

10. A semiconductor device comprising:
    a first internal voltage driving unit configured to drive an internal voltage in response to a power supply voltage;
    a plurality of second internal voltage driving units configured to respectively drive the internal voltage in response to a plurality of enable signals;
    a current amount detection unit configured to detect amount of current supplied by the first internal voltage driving unit; and
    a current amount comparison unit configured to compare the amount of detected current by the current amount detection unit with amount of a reference current which changes depending upon the number of enable signals activated among the plurality of enable signals, and control the number of enable signals to be activated in response to a comparison result.

11. The semiconductor device of claim 10, wherein each of the plurality of second internal voltage driving units comprises:
    a second level comparison section configured to be controlled in its on/off operation in response to any one signal of the plurality of enable signals, and compare a voltage level of the internal voltage with a voltage level of a level reference voltage; and
    a second drive sourcing current amount control section configured to control amount of current flowing from a terminal of a power supply voltage to an output terminal of the internal voltage in response to an output signal of the second level comparison section.

12. The semiconductor device of claim 11, wherein the current amount comparison unit comprises:
    a comparison sourcing current amount control section configured to control the reference current to flow between the terminal of the power supply voltage and a current amount comparison node in response to a current amount reference voltage and the plurality of enable signals;
    a comparison sinking current amount control section configured to control amount of current flowing from the current amount comparison node to a terminal of a ground voltage in response to the output signal of the current amount detection unit; and
    an enable signal generation section configured to generate the plurality of enable signal of which activation or deactivation is determined in response to a voltage level of the current amount comparison node.

13. The semiconductor device of claim 12, wherein the comparison sourcing current amount control section comprises:
    a basic comparison sourcing current amount control part configured to control amount of current flowing between the terminal of the power supply voltage and the current amount comparison node in response to the current amount reference voltage; and a plurality of additional comparison sourcing current amount control parts configured to be controlled in their on/off operations in response to the plurality of enable signals, and control the amount of the current flowing between the terminal of the power supply voltage and the current amount comparison node in response to the current amount reference voltage.

14. The semiconductor device of claim 13, wherein the plurality of additional comparison sourcing current amount control parts are turned off when a corresponding enable signal among the plurality of enable signals is in an activated state, and are turned on and control current with a magnitude corresponding to the current amount reference voltage to flow between the terminal of the power supply voltage and the current amount comparison node when the corresponding enable signal is in a deactivated state.

15. The semiconductor device of claim 12, wherein the enable signal generation section comprises:

a level determination part configured to determine the voltage level of the current amount comparison node based on a voltage level of an enable reference voltage; and an activation control part configured to determine whether or not to activate the plurality of enable signals in response to an output signal of the level determination part.

16. The semiconductor device of claim 15, wherein the level determination part activates a rising determination signal and deactivates a falling determination signal when the voltage level of the current amount comparison node is higher than the voltage level of the enable reference voltage by a predefined voltage level;

deactivates the rising determination signal and activates the falling determination signal when the voltage level of the current amount comparison node is lower than the voltage level of the enable reference voltage by the predefined voltage level; and activates both the rising determination signal and the falling determination signal when a difference between the voltage level of the current amount comparison node and the voltage level of the enable reference voltage is less than the predefined voltage level.

17. The semiconductor device of claim 16, wherein the activation control part sequentially activates enable signals in deactivated states among the plurality of enable signals one by one every predetermined cycle during a period in which the falling determination signal is activated and the rising determination signal is deactivated, and sequentially deactivates enable signals in activated states among the plurality of enable signals one by one every predetermined cycle during a period in which the rising determination signal is activated and the falling determination signal is deactivated.

18. The semiconductor device of claim 10, wherein the current amount comparison unit sequentially deactivates enable signals in activated states among the plurality of enable signals every predetermined cycle during a period in which the amount of the detected current is smaller than the amount of the reference current; and sequentially activates enable signals in deactivated states among the plurality of enable signals every predetermined cycle during a period in which the amount of the detected current is larger than the amount of the reference current.

19. The semiconductor device of claim 10, wherein a sequence in which enable signals in the deactivated states among the plurality of enable signals are activated and a sequence in which enable signals in the activated states among the plurality of enable signals are deactivated are set in advance.

20. The semiconductor device of claim 10, wherein the plurality of second internal voltage driving units drive the internal voltage with respectively different driving forces.

21. The semiconductor device of claim 10, wherein the plurality of second internal voltage driving units drive the internal voltage with the same driving force.

22. A method for operating a semiconductor device, comprising:

detecting amount of current, supplied from a terminal of a power supply voltage to an output terminal of an internal voltage, based on a first reference current amount when the output terminal of the internal voltage is driven by using a first driving force, and determining whether or not to activate a first enable signal; and driving the output terminal of the internal voltage using a first summed driving force obtained by summing the first driving force and a second driving force in response to the first enable signal.

23. The method of claim 22, further comprising:

detecting amount of current, supplied from the terminal of the power supply voltage to the output terminal of the internal voltage, based on a second reference current amount when the output terminal of the internal voltage is driven by using the first summed driving force, and determining whether or not to activate a second enable signal; and driving the output terminal of the internal voltage using a second summed driving force obtained by summing the first and second driving forces and a third driving force, in response to the second enable signal.

24. The method of claim 23, wherein the determining of whether or not to activate the first enable signal comprises:

deactivating the first enable signal when the amount of the current supplied from the terminal of the power supply voltage to the output terminal of the internal voltage due to driving of the output terminal of the internal voltage by the first driving force is smaller than the first reference current amount; and activating the first enable signal when the amount of the current supplied from the terminal of the power supply voltage to the output terminal of the internal voltage due to driving of the output terminal of the internal voltage by the first driving force is larger than the first reference current amount.

25. The method of claim 24, wherein the determining of whether or not to activate the second enable signal comprises:

deactivating the second enable signal when the amount of the current supplied from the terminal of the power supply voltage to the output terminal of the internal voltage due to driving of the output terminal of the internal voltage by the first summed driving force is smaller than the second reference current amount during an activated period of the first enable signal;

activating the second enable signal when the amount of the current supplied from the terminal of the power supply voltage to the output terminal of the internal voltage due to driving of the output terminal of the internal voltage by the first summed driving force is larger than the second reference current amount during the activated period of the first enable signal; and deactivating the second enable and driving the output terminal of the internal voltage using the first driving force signal during a deactivated period of the first enable signal.

26. The method of claim 25, wherein the driving of the output terminal of the internal voltage using the second summed driving force comprises:
- driving the output terminal of the internal voltage using the second summed driving force during an activated period of the second enable signal; and
- driving the output terminal of the internal voltage using the first summed driving force or the first driving force depending upon whether or not the first enable signal is activated, during a deactivated period of the second enable signal.

27. The method of claim 23, wherein a magnitude of the second reference current amount is larger than a magnitude of the first reference current amount.

28. The method of claim 24, wherein the determining of whether or not to activate the second enable signal comprises:
- deactivating the second enable signal in the case where the amount of the current supplied from the terminal of the power supply voltage to the output terminal of the internal voltage due to driving of the output terminal of the internal voltage by the first driving force is smaller than the second reference current amount when the output terminal of the internal voltage is driven by using the first summed driving force during the activated period of the first enable signal;
- activating the second enable signal in the case where the amount of the current supplied from the terminal of the power supply voltage to the output terminal of the internal voltage due to driving of the output terminal of the internal voltage by the first driving force is larger than the second reference current amount when the output terminal of the internal voltage is driven by using the first summed driving force during the activated period of the first enable signal; and
- deactivating the second enable signal and driving the output terminal of the internal voltage using the first driving force during the deactivated period of the first enable signal.

29. The method of claim 28, wherein the driving of the output terminal of the internal voltage using the second summed driving force comprises:
- driving the output terminal of the internal voltage using the second summed driving force during the activated period of the second enable signal; and
- driving the output terminal of the internal voltage using the first summed driving force or the first driving force depending upon whether or not the first enable signal is activated, during the deactivated period of the second enable signal.

30. The method of claim 29, wherein a magnitude of the second reference current amount is larger than a magnitude of the first reference current amount.

31. A semiconductor device, comprising:
- a comparison sourcing current amount control section configured to control a reference current which of level varies in response to a plurality of enable signals to flow from a terminal of a power supply voltage to a current amount comparison node in response to a current amount reference voltage;
- a comparison sinking current amount control section configured to control a detected current to flow from the current amount comparison node to a terminal of a ground voltage; and
- an enable signal generation section configured to generate the plurality of enable signal by comparing a voltage level of the current amount comparison node with an enable reference voltage.

32. The semiconductor device of claim 31, wherein the plurality of enable signals are sequentially deactivated every predetermined cycle when the amount of the detected current becomes smaller than the amount of the reference current, and sequentially activated every predetermined cycle when the amount of the detected current becomes larger than the amount of the reference current.

33. The semiconductor device of claim 32, wherein the plurality of enable signals are sequentially activated every predetermined cycle when the voltage level of the current amount comparison node is lower than a voltage level of the enable reference voltage by a predefined voltage level, and sequentially deactivated every predetermined cycle when the voltage level of the current amount comparison node is higher than the voltage level of the enable reference voltage by the predefined voltage level.

* * * * *